United States Patent
Lee et al.

(10) Patent No.: US 8,572,469 B2
(45) Date of Patent: *Oct. 29, 2013

(54) TURBO DECODER EMPLOYING ARP (ALMOST REGULAR PERMUTATION) INTERLEAVE AND ARBITRARY NUMBER OF DECODING PROCESSORS

(75) Inventors: Tak K. Lee, Irvine, CA (US); Ba-Zhong Shen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 447 days.

This patent is subject to a terminal disclaimer.

(21) Appl. No.: 12/915,936

(22) Filed: Oct. 29, 2010

(65) Prior Publication Data

US 2011/0047436 A1 Feb. 24, 2011

Related U.S. Application Data

(63) Continuation of application No. 11/811,014, filed on Jun. 7, 2007, now Pat. No. 7,827,473.

(60) Provisional application No. 60/850,492, filed on Oct. 10, 2006, provisional application No. 60/872,367, filed on Dec. 1, 2006, provisional application No. 60/872,716, filed on Dec. 4, 2006, provisional application No. 60/861,832, filed on Nov. 29, 2006, provisional application No. 60/879,301, filed on Jan. 8, 2007.

(51) Int. Cl.
*H03M 13/03* (2006.01)

(52) U.S. Cl.
USPC .......................................... 714/794; 714/795

(58) Field of Classification Search
USPC .................................. 714/794, 795
See application file for complete search history.

(56) References Cited

U.S. PATENT DOCUMENTS

| | | | | |
|---|---|---|---|---|
| 5,721,745 A | * | 2/1998 | Hladik et al. | 714/755 |
| 5,734,962 A | * | 3/1998 | Hladik et al. | 455/12.1 |
| 6,023,783 A | * | 2/2000 | Divsalar et al. | 714/792 |
| 6,580,767 B1 | * | 6/2003 | Koehler et al. | 375/341 |
| 6,594,792 B1 | * | 7/2003 | Hladik et al. | 714/755 |
| 6,678,843 B2 | * | 1/2004 | Giulietti et al. | 714/701 |
| 6,715,120 B1 | * | 3/2004 | Hladik et al. | 714/755 |
| 6,775,800 B2 | * | 8/2004 | Edmonston et al. | 714/755 |
| 6,789,218 B1 | * | 9/2004 | Edmonston et al. | 714/701 |
| 6,983,412 B2 | * | 1/2006 | Fukumasa | 714/755 |
| 7,113,554 B2 | * | 9/2006 | Dielissen et al. | 375/341 |
| 7,180,843 B2 | * | 2/2007 | Furuta et al. | 369/59.22 |
| 7,281,198 B2 | * | 10/2007 | Yagihashi | 714/794 |
| 7,302,621 B2 | * | 11/2007 | Edmonston et al. | 714/702 |

(Continued)

*Primary Examiner* — Joseph D Torres
(74) *Attorney, Agent, or Firm* — Garlick & Markison; Shayne X. Short

(57) ABSTRACT

Turbo decoder employing ARP (almost regular permutation) interleave and arbitrary number of decoding processors. A novel approach is presented herein by which an arbitrarily selected number (M) of decoding processors (e.g., a plurality of parallel implemented turbo decoders) be employed to perform decoding of a turbo coded signal while still using a selected embodiment of an ARP (almost regular permutation) interleave. The desired number of decoding processors is selected, and very slight modification of an information block (thereby generating a virtual information block) is made to accommodate that virtual information block across all of the decoding processors during all decoding cycles except some dummy decoding cycles. In addition, contention-free memory mapping is provided between the decoding processors (e.g., a plurality of turbo decoders) and memory banks (e.g., a plurality of memories).

20 Claims, 20 Drawing Sheets

(56) References Cited

U.S. PATENT DOCUMENTS

| | | | |
|---|---|---|---|
| 7,530,011 B2* | 5/2009 | Obuchii et al. | 714/794 |
| 7,720,017 B2* | 5/2010 | Khan | 370/310 |
| 7,827,473 B2* | 11/2010 | Lee et al. | 714/794 |
| 2006/0101319 A1* | 5/2006 | Park et al. | 714/755 |

\* cited by examiner

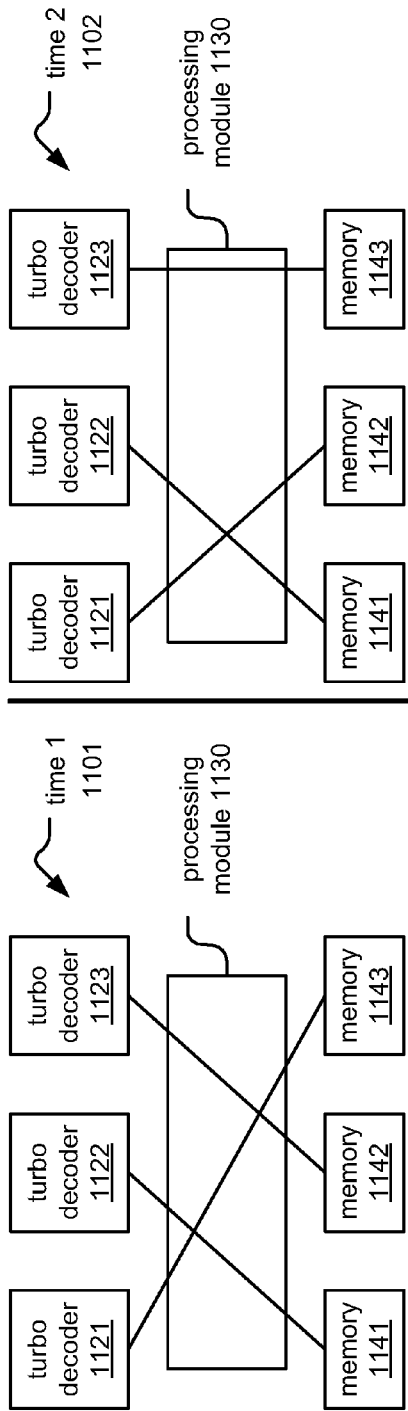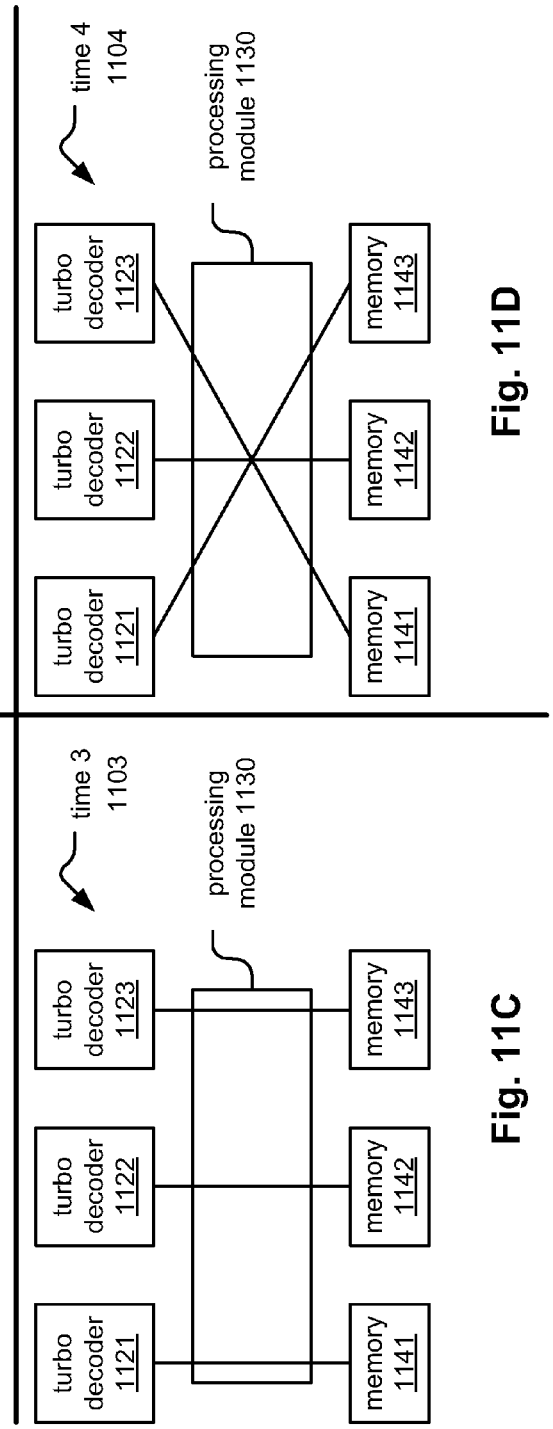

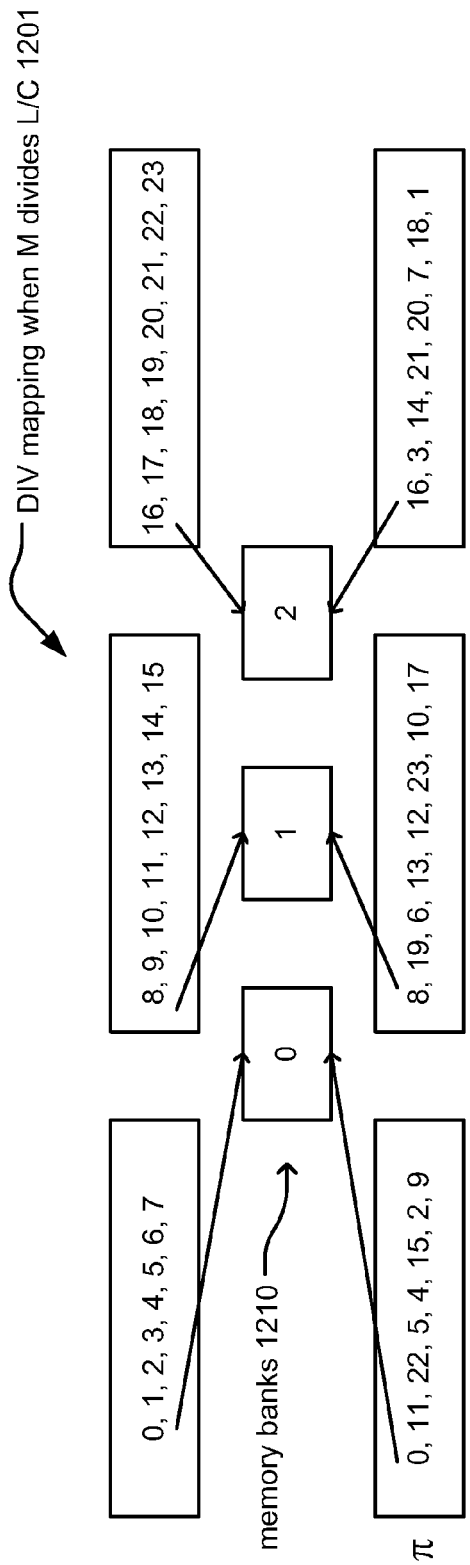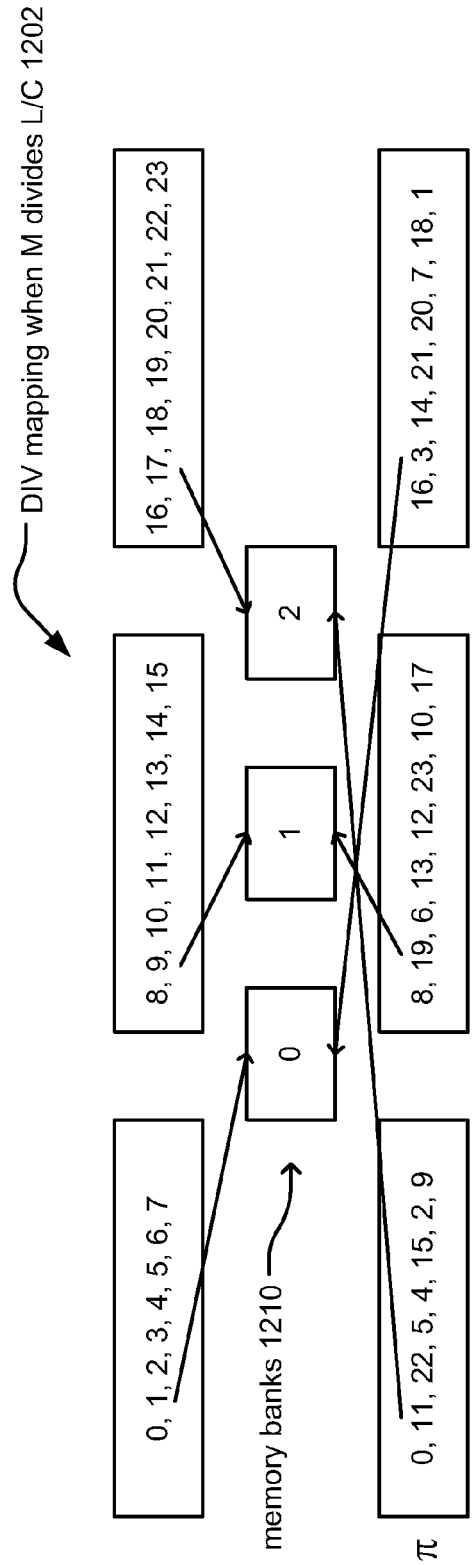

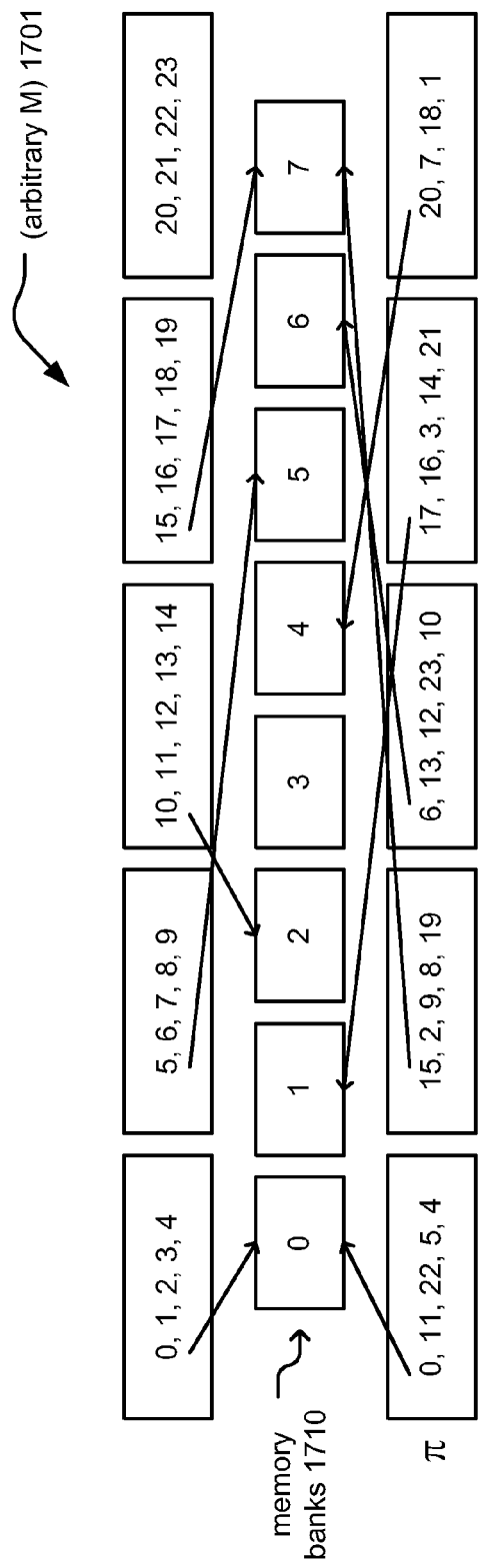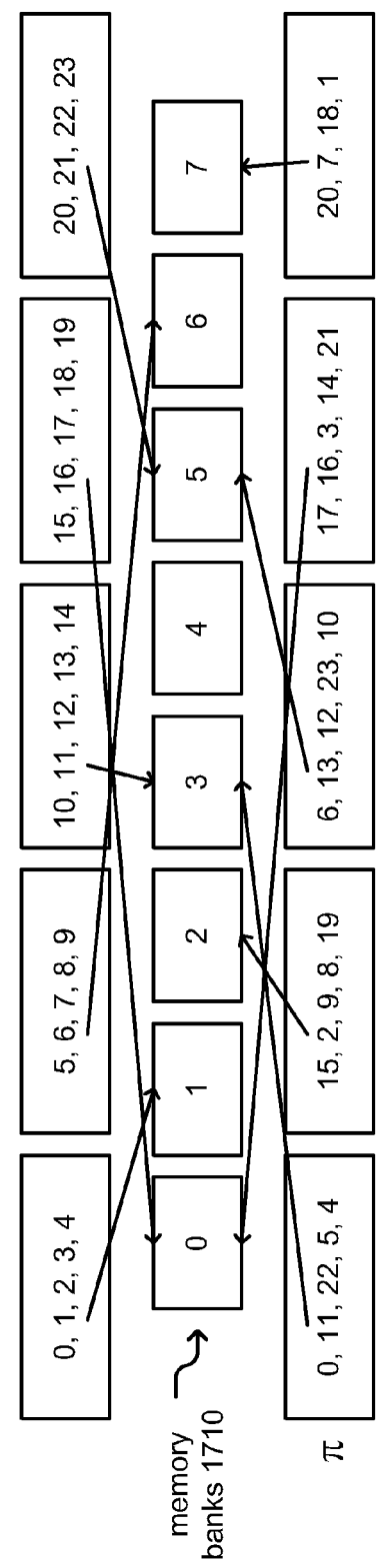
Fig. 17A
Fig. 17B

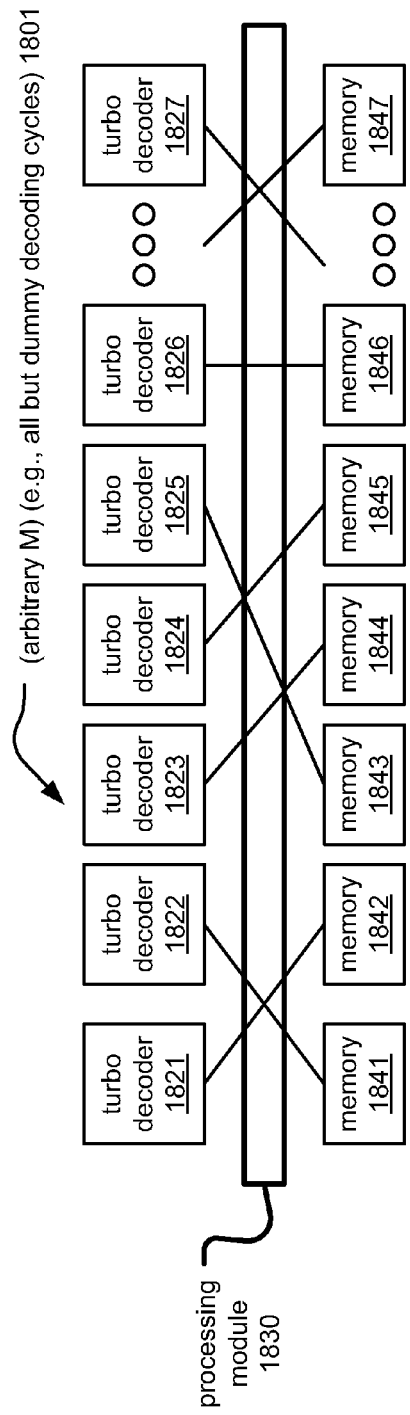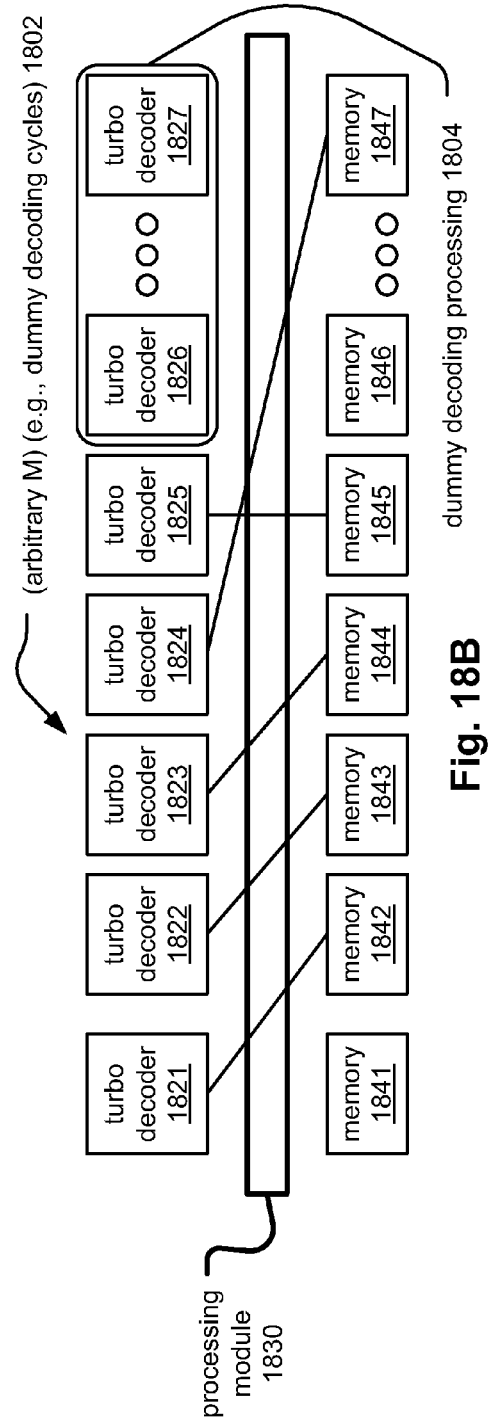
Fig. 18A
Fig. 18B

TURBO DECODER EMPLOYING ARP (ALMOST REGULAR PERMUTATION) INTERLEAVE AND ARBITRARY NUMBER OF DECODING PROCESSORS

CROSS REFERENCE TO RELATED PATENTS/PATENT APPLICATIONS

Continuation Priority Claim, 35 U.S.C. §120

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility application Ser. No. 11/811,014, entitled "Turbo decoder employing ARP (almost regular permutation) interleave and arbitrary number of decoding processors," filed Jun. 7, 2007, pending, and scheduled to be issued as U.S. Pat. No. 7,827,473 on Nov. 2, 2010, which claims priority pursuant to 35 U.S.C. §119(e) to the following U.S. Provisional Patent Applications which are hereby incorporated herein by reference in their entirety and made part of the present U.S. Utility Patent Application for all purposes:
   a. U.S. Provisional Application Ser. No. 60/850,492, entitled "General and algebraic-constructed contention-free memory mapping for parallel turbo decoding with algebraic interleave ARP (almost regular permutation) of all possible sizes," filed Oct. 10, 2006.
   b. U.S. Provisional Application Ser. No. 60/872,367, entitled "Turbo decoder employing ARP (almost regular permutation) interleave and inverse thereof as de-interleave," filed Dec. 1, 2006.
   c. U.S. Provisional Application Ser. No. 60/872,716, entitled "Turbo decoder employing ARP (almost regular permutation) interleave and arbitrary number of decoding processors," filed Dec. 4, 2006.
   d. U.S. Provisional Application Ser. No. 60/861,832, entitled "Reduced complexity ARP (almost regular permutation) interleaves providing flexible granularity and parallelism adaptable to any possible turbo code block size," filed Nov. 29, 2006.
   e. U.S. Provisional Application Ser. No. 60/879,301, entitled "Address generation for contention-free memory mappings of turbo codes with ARP (almost regular permutation) interleaves," filed Jan. 8, 2007.

INCORPORATION BY REFERENCE

The following U.S. Utility Patent Applications are hereby incorporated herein by reference in their entirety and made part of the present U.S. Utility Patent Application for all purposes:

1. U.S. Utility application Ser. No. 11/704,068, entitled "General and algebraic-constructed contention-free memory mapping for parallel turbo decoding with algebraic interleave ARP (almost regular permutation) of all possible sizes," filed Feb. 8, 2007, pending.

2. U.S. Utility application Ser. No. 11/657,819, entitled "Turbo decoder employing ARP (almost regular permutation) interleave and inverse thereof as de-interleave," filed Jan. 25, 2007, pending.

3. U.S. Utility application Ser. No. 11/811,013, entitled "Reduced complexity ARP (almost regular permutation) interleaves providing flexible granularity and parallelism adaptable to any possible turbo code block size," filed Jun. 7, 2007, pending.

4. U.S. Utility application Ser. No. 11/810,989, entitled "Address generation for contention-free memory mappings of turbo codes with ARP (almost regular permutation) interleaves," filed Jun. 7, 2007, pending, and scheduled to be issued as U.S. Pat. No. 7,831,894 on Nov. 9, 2010.

BACKGROUND OF THE INVENTION

The invention relates generally to communication systems; and, more particularly, it relates to communication systems employing turbo coding.

DESCRIPTION OF RELATED ART

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

The use of turbo codes providing such relatively lower error rates, while operating at relatively low data throughput rates, has largely been in the context of communication systems having a large degree of noise within the communication channel and where substantially error free communication is held at the highest premium. Some of the earliest application arenas for turbo coding were space related where accurate (i.e., ideally error free) communication is often deemed an essential design criterion. The direction of development then moved towards developing terrestrial-applicable and consumer-related applications. Still, based on the heritage of space related application, the focus of effort in the turbo coding environment then continued to be achieving relatively lower error floors, and not specifically towards reaching higher throughput.

More recently, focus in the art has been towards developing turbo coding, and variants thereof, that are operable to support higher amounts of throughput while still preserving the relatively low error floors offered within the turbo code context.

In fact, as the throughput requirement in communication systems increases, parallel turbo decoding, which employs a plurality of processors and a plurality of memory banks, become necessary. Many of the current systems support a wide range of codeword sizes. Thus, efficiency and flexibility in parallel turbo decoder design is of critical importance.

Generally speaking, within the context of communication systems that employ turbo codes, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 11A, FIG. 11B, FIG. 11C, and FIG. 11D illustrates various, successive contention-free memory mappings between turbo decoders and memories.

FIG. 12A and FIG. 12B illustrate embodiments of DIV memory mapping of a plurality of memories memory banks.

FIG. 17A and FIG. 17B illustrate embodiments of parallel turbo decoding of a turbo coded signal when employing an arbitrarily selected number (M) of decoding processors and employing MOD memory mapping a plurality of memories memory banks.

FIG. 18A illustrates an embodiment of a turbo decoder that is operable to perform decoding of a turbo coded signal when employing an arbitrarily selected number (M) of decoding processors for all decoding cycles except dummy decoding cycles.

FIG. 18B illustrates an embodiment of a turbo decoder that is operable to perform decoding of a turbo coded signal when employing an arbitrarily selected number (M) of decoding processors for dummy decoding cycles.

DETAILED DESCRIPTION OF THE INVENTION

Many communication systems incorporate the use of a turbo code. While there are many potential applications that can employ turbo codes, means are presented herein that can be applied to the 3GPP channel code to support an arbitrary number of information bits. Some examples of the number of bits that can be supported using the various aspects of the invention presented herein are 40 to 5114 for WCDMA and HSDPA and more for LTE.

Additional information regarding the UTRA-UTRAN Long Term Evolution (LTE) and 3GPP System Architecture Evolution (SAE) can be found at the following Internet web site:

www.3gpp.org

Within the channel coding system in 3GPP LTE, there is a need and desire to supply and provide for a wide range of block sizes (i.e., turbo code block lengths). Furthermore, turbo decoding of this system generally needs to be implemented using a parallel decoding arrangement because of the very high data throughput and large block size desired. The parallel decoding requires the contention-free memory accessing (i.e., any one turbo decoder (of a group of parallel arranged turbo decoders) accesses only memory (of a group of parallel arranged memories) at any given time). Turbo coding was suggested for 3GPP LTE channel coding. For this coding system, the algebraic interleave referred to as the "almost regular permutation (ARP)" in reference [1] is considered as one of the candidates.

Figure 1:
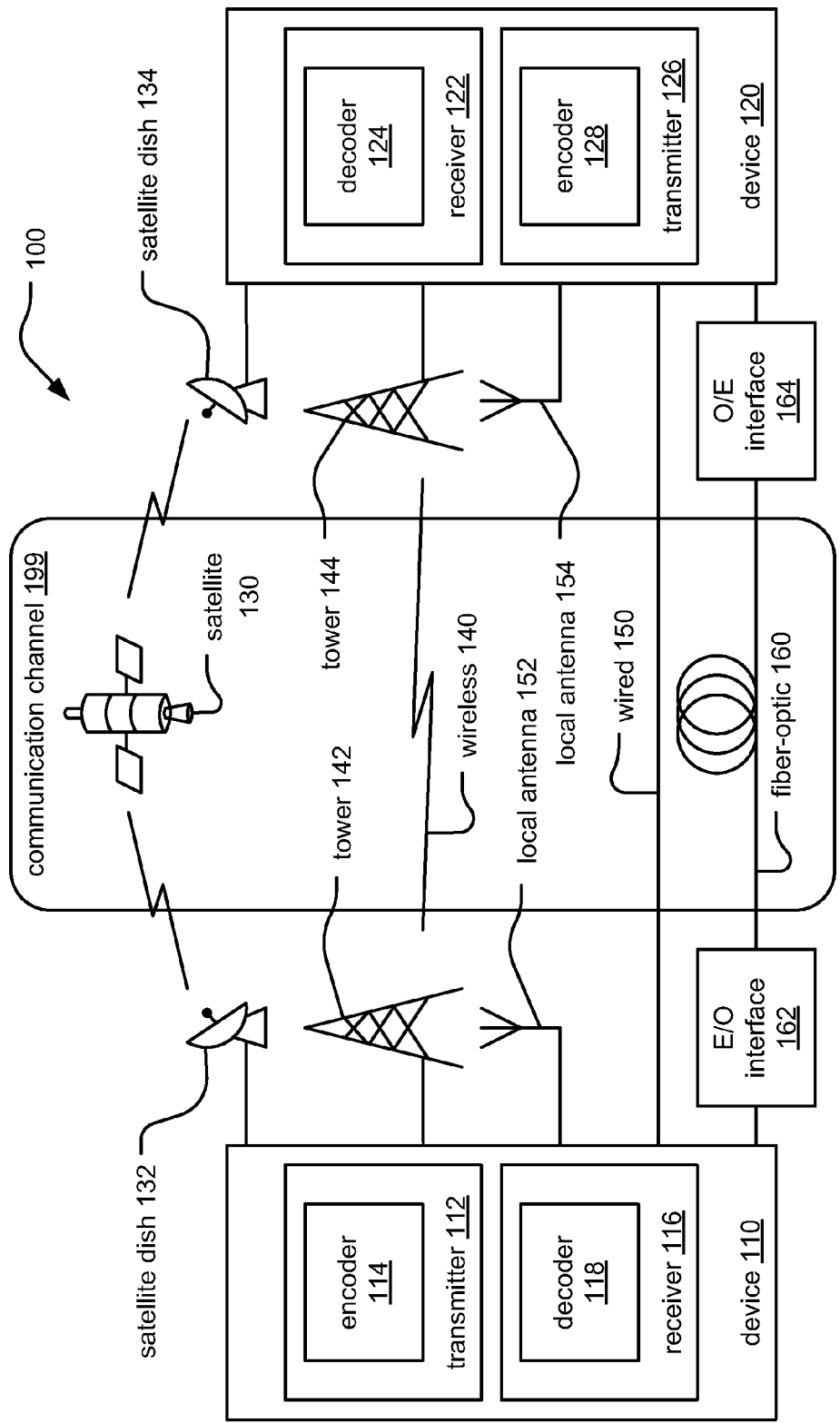
FIG. 1 illustrates an embodiment of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

Figure 2:
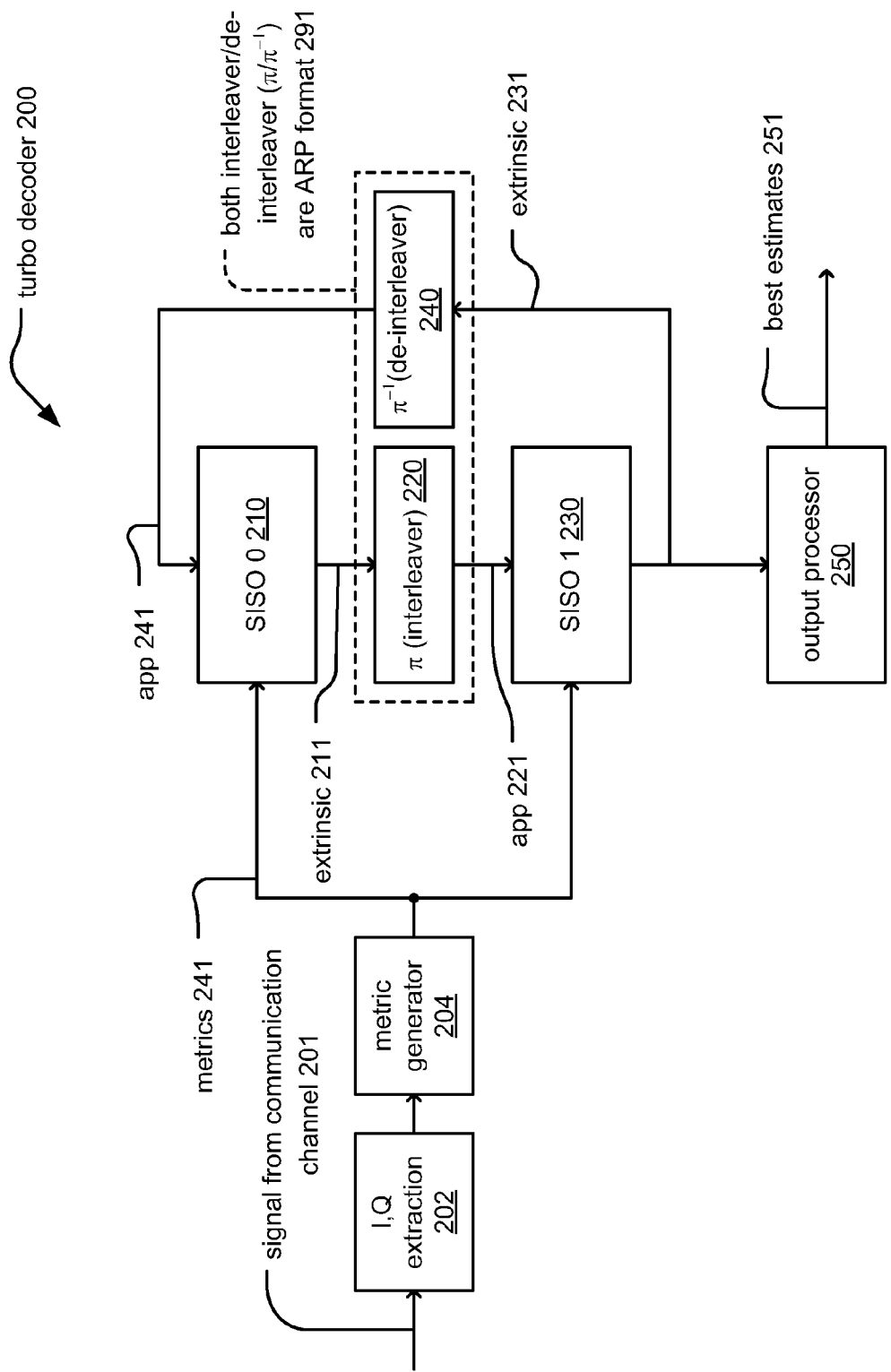
FIG. 2 illustrates an embodiment of a turbo decoder.

FIG. 2 illustrates an embodiment of a turbo decoder 200. A received signal (e.g., typically received from a communication channel) is provided to an I,Q extraction module 202 that extracts the I,Q (in-phase and quadrature) components from the received signal 201. This may be viewed as being receiver pre-processing, and it can include any appropriate frequency conversion (typically down-conversion from a carrier frequency, if needed). The I,Q can then be mapped according to the modulation's appropriate constellation and mapping. Then, the mapped I,Q is passed to a metric generator 204. The metric generator 204 generates the appropriate metrics 241 that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation.

Continuing on with the turbo decoding process and functionality, the metrics 241 that are calculated by the metric generator 204 are then provided simultaneously to a first soft-in/soft-out (SISO 0) decoder 210 and a second SISO 1 decoder 230. In the context of trellis coding (e.g., turbo trellis coded modulation (TTCM)), each of the first SISO 0 decoder 210 and the second SISO 1 decoder 230 calculates forward metrics (alphas) and backward metrics (betas), and extrinsic values according to the trellis employed.

These alphas, betas, and extrinsics are all calculated for each symbol within a frame that is to be decoded. These calculations of alphas, betas, and extrinsics are all based on the trellis.

Starting with the first SISO 0 decoder 210, after the extrinsic values 211 have been calculated, they are passed to an interleaver ($\pi$) 220 after which it is passed to the second SISO 1 decoder 230 as "a priori probability" (app) information 221. Similarly, after extrinsic values 231 have been calculated within the second SISO 1 decoder 230, they are passed to a de-interleaver ($\pi^{-1}$) 240 after which it is passed to the first SISO 0 decoder 210 as "a priori probability" (app) information 241. It is noted that a single decoding iteration, within the iterative decoding process of the turbo decoder 200 consists of performing two SISO operations; that is to say, the iterative decoding process must pass through both the first SISO 0 decoder 210 and through the second SISO 1 decoder 230.

After a significant level of confidence has been achieved and a solution is being converged upon, or after a predetermined number of decoding iterations have been performed, then the output from the second SISO 1 decoder 230 is passed as output to an output processor 250. The operation of the SISOs 210 and 230 may generally be referred to as calculating soft symbol decisions of the symbol contained within the received symbol. These soft symbol decisions may be performed on a true bit level in certain embodiments. The output processor 250 uses these soft symbol decisions to generate best estimates 251 (e.g., hard bit and/or symbol decisions) for the information bits that have been encoded within the original turbo coded signal (e.g., generally within a turbo encoder location at another end of a communication channel into which the signal 201 was originally launched.

It is also noted that each of the interleaving performed within the interleaver ($\pi$) 220 can be performed using an embodiment of an ARP interleave, as shown by reference numeral 291. Also, there are embodiment in which the de-interleaving performed within the de-interleaver ($\pi^{-1}$) 240 can also be performed using an embodiment of an ARP de-interleave.

Many of the embodiments presented herein employ various embodiments of the ARP (almost regular permutation) interleaves. Even more details are provided below with respect to the means by which a structure can be employed to perform both ARP interleaving and ARP de-interleaving. Before doing so, however, a regular permutation is considered for comparative analysis for the reader.

Figure 3:
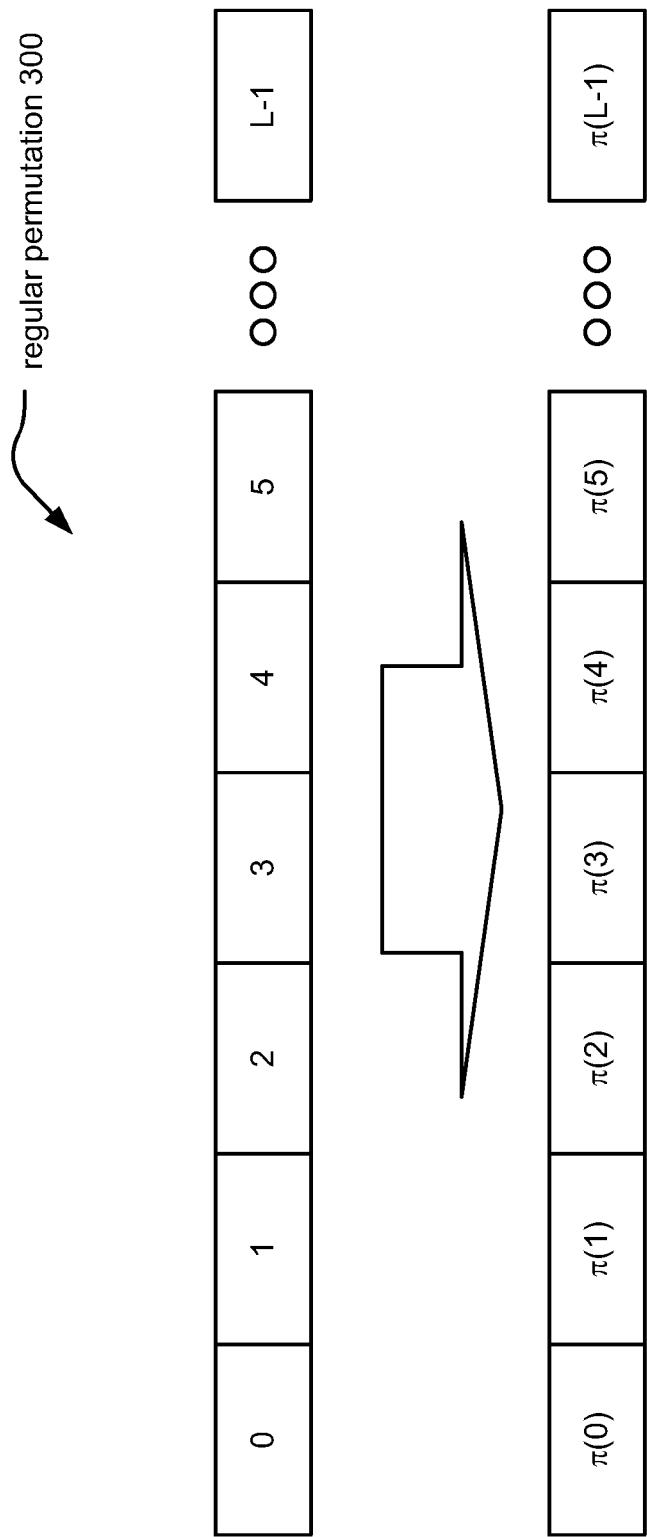
FIG. 3 illustrates an embodiment of a regular permutation.

FIG. 3 illustrates an embodiment of a regular permutation 300. This regular permutation 300 can alternatively be referred to as a circular permutation. For example, this regular (circular) permutation 300 can be defined as follows:

$$i=\pi(j)=Pj \bmod L, 0 \leq i,j \leq L-1$$

L is the frame size, and gcd(P,L)=1, which then implies that $\pi(j) \neq \pi(j')$ if $j \neq j'$.

The implementation of the regular permutation 300 is relatively straight-forward, but the performance is not very good.

An ARP (almost regular permutation) of information block size L=CW (i.e. C is a divider of L) introduced in reference [1] is defined by $$i=\pi(j)=jP+\theta+A(j \bmod C)P+B(j \bmod C) \bmod L$$

where P is relative prime to L, $\theta$ is a constant and A(x) and B(x) are integer function defined on $\{0, 1, \ldots, C-1\}$. To insure the function defined the function is a permutation (i.e. one to one and on to), in reference [1] A(x) and B(x) are further restricted to $$A(i)P+B(i)=C[\alpha(i)P+\beta(i)], i=0, \ldots, C-1$$

where $\alpha$ and $\beta$ are integer functions. In this document, we call C the dithering cycle of the ARP.

As can be seen, C|L (thus gcd(C,P)=1), and therefore $\pi(j) \neq \pi(j')$, if $j \neq j'$.

For example, if L<2000, then C=4, otherwise a larger C is necessary.

Example: C=4

$$4[\alpha(4l+u)P+\beta(4l+u)] = \begin{cases} 0 & \text{if } u = 0 \\ 4P+4\beta_1 & \text{if } u = 1 \\ 4\beta_2 & \text{if } u = 2 \\ 4P+4\beta_3 & \text{if } u = 3 \end{cases}$$

A first example of an ARP interleave is provided here:

$$y=\pi(x)=Px+C[\alpha(x \bmod C)P+\beta(x \bmod C](\bmod L)$$

L=24, C=4, P=7

$$\alpha(u) = \begin{cases} 0 & \text{if } u = 0 \\ 0 & \text{if } u = 1 \\ 1 & \text{if } u = 2 \\ 1 & \text{if } u = 3 \end{cases}, \text{ and } \beta(u) = \begin{cases} 0 & \text{if } u = 0 \\ 1 & \text{if } u = 1 \\ 1 & \text{if } u = 2 \\ 1 & \text{if } u = 3, \end{cases}$$

which indicates that $$\pi(x) = \begin{cases} xP \bmod L & \text{if } x = 0 \bmod 4 \\ (xP+4) \bmod L & \text{if } x = 1 \bmod 4 \\ (xP+4P+4) \bmod L & \text{if } x = 2 \bmod 4 \\ (xP+4P+4) \bmod L & \text{if } x = 3 \bmod 4 \end{cases}$$

If the inputs of the following are provided to such an ARP interleave ($\pi$), 0,1,2,3, x 4,5,6,7, x 8,9,10,11, x 12,13,14,15, x 16,17,18,19, x 20,21,22,23, then the output thereof is as follows:

0,11,22,5, x 4,15,2,9, x 8,19,6,13, x 12,23,10,17, x 16,3,14,21, x 20,7,18,1.

Another example of an ARP interleave is provided here:

$$y = \pi(x) = Px + C[\alpha(x \bmod C)P + \beta(x \bmod C)] (\bmod L)$$

L=20, C=4, P=3

$$A(u) = \begin{cases} 0 & \text{if } u = 0 \\ 0 & \text{if } u = 1 \\ 3 & \text{if } u = 2 \\ 1 & \text{if } u = 3 \end{cases}, \text{ and } B(u) = \begin{cases} 0 & \text{if } u = 0 \\ 2 & \text{if } u = 1 \\ 0 & \text{if } u = 2 \\ 2 & \text{if } u = 3 \end{cases}, \text{ and } \theta = 1.$$

$$\pi(x) = \begin{cases} xP+1 \bmod L & \text{if } x = 0 \bmod 4 \\ (xP+2+1) \bmod L & \text{if } x = 1 \bmod 4 \\ (xP+3P+1) \bmod L & \text{if } x = 2 \bmod 4 \\ (xP+1P+2+1) \bmod L & \text{if } x = 3 \bmod 4 \end{cases}$$

If the inputs of the following are provided to such an ARP interleave ($\pi$), 0,1,2,3, x 4,5,6,7, x 8,9,10,11, x 12,13,14,15, x 16,17,18,19 then the output thereof is as follows:

1,6,16,15, x 13,18,8,7, x 5,10,0,19, x 17,2,12,11, x 9,14,4,3.

There are some special cases for ARP as well.

Case 1:

$A(x) = C\alpha(x)$, and $B(x) = C\beta(x)$

When $\theta = 0$, equations (10), (11) and (12) in reference [1].

When $\theta = 3$, $C = 4$, [2] France Telecom, GET, "Enhancement of Rel. 6 turbo Code," 3GPP TSG RAN WG1#43, R1-051310, 2005

When $\theta = 3$, $C = 4$ and 8, Table 1, [3] Motorola, "A contention-free interleaver design for LTE codes,", 3GPP TSG RAN WG1#47.

Case 2:

equations (13) in reference [1].

In addition, certain properties of ARP are also provided below:

Property 1:

$x_0 = x_1 \bmod C$, which implies that $\pi(x_0) = \pi(x_1) \bmod C$.

Proof: Set $x_1 = x_0 + kC$. Then $\pi(x_1) - \pi(x_0) = PkC = 0 \bmod C$.

Property 2:

Define $\Psi: \{0, 1, \ldots C-1\} \mapsto \{0, 1, \ldots C-1\}$ by $\psi(u) = \pi(u) \bmod C$.

$\pi$ is a permutation, which implies that $\Psi$ is a bijection.

Proof: Assume $u_0, u_1 \in \{0, 1, \ldots C-1\}$, $u_0 \cdot u_1$, but $\Psi(u_0) = \Psi(u_1)$. There are L/C elements in $\{0, 1, \ldots L-1\}$ congruent $u_0$ modulo C and another L/C elements congruent $u_1$ modulo C. So, by property 1, there are 2 L/C elements u such that $\pi(u)$ have the same congruence module C. This contradicts the hypothesis that $\pi$ is a permutation.

Property 3:

Define $\Psi: \{0, 1, \ldots C-1\} \mapsto \{0, 1, \ldots C-1\}$ by $\psi(u) = \pi(u) \bmod C$.

$\Psi$ is a bijection, then $\pi$ is a permutation.

Proof: Assume $x_0, x_1 \in \{0, 1, \ldots L-1\}$, $x_0 < x_1$, but $\pi(x_0) = \pi(x_1)$. Let $u_0 = x_0 \bmod C$ and $u_1 = x_1 \bmod C$. If $u_0 \ne u_1$, then $\pi(x_0) \bmod C \ne \pi(x_1) \bmod C$ since $\Psi$ is a bijection. If $u_0 = u_1$, then let $x_1 = x_0 + kC$ for a $k \in \{0, 1, \ldots, L/C-1\}$. So, $\pi(x_1) - \pi(x_0) = PkC \bmod L$. Since $\gcd(P,L) = 1$ and $C|L$, $PkC \bmod L = 0$ implies $k = 0$ or k divides L/C. By the range on k, a contradiction cannot be avoided; so, $\pi(x_0) = \pi(x_1)$ can only occur if $x_0 = x_1$.

Property 4:

If $\pi(x)$ is an ARP interleave ($\pi$) with period C, then $\pi(x)$ is also an ARP interleave ($\pi$) with period $\tilde{C} = mC$ provided $\tilde{C}|L$.

Proof: Let $\pi(x) = [Px + A(x \bmod C)P + B(x \bmod C) + \theta] \bmod L$.

Clearly, $\pi(x)$ can also be written as follows:

$\pi(x) = [Px + \tilde{A}(x \bmod \tilde{C})P + \tilde{B}(x \bmod \tilde{C}) + \theta] \bmod L$, where $\tilde{A}(x \bmod \tilde{C}) \stackrel{def}{=} A(x \bmod C)$ and $\tilde{B}(x \bmod \tilde{C}) \stackrel{def}{=} B(x \bmod C)$.

So, if $\tilde{C}|L$, then $\pi(x)$ is an ARP interleave ($\pi$) with period $\tilde{C}$.

Figure 4:
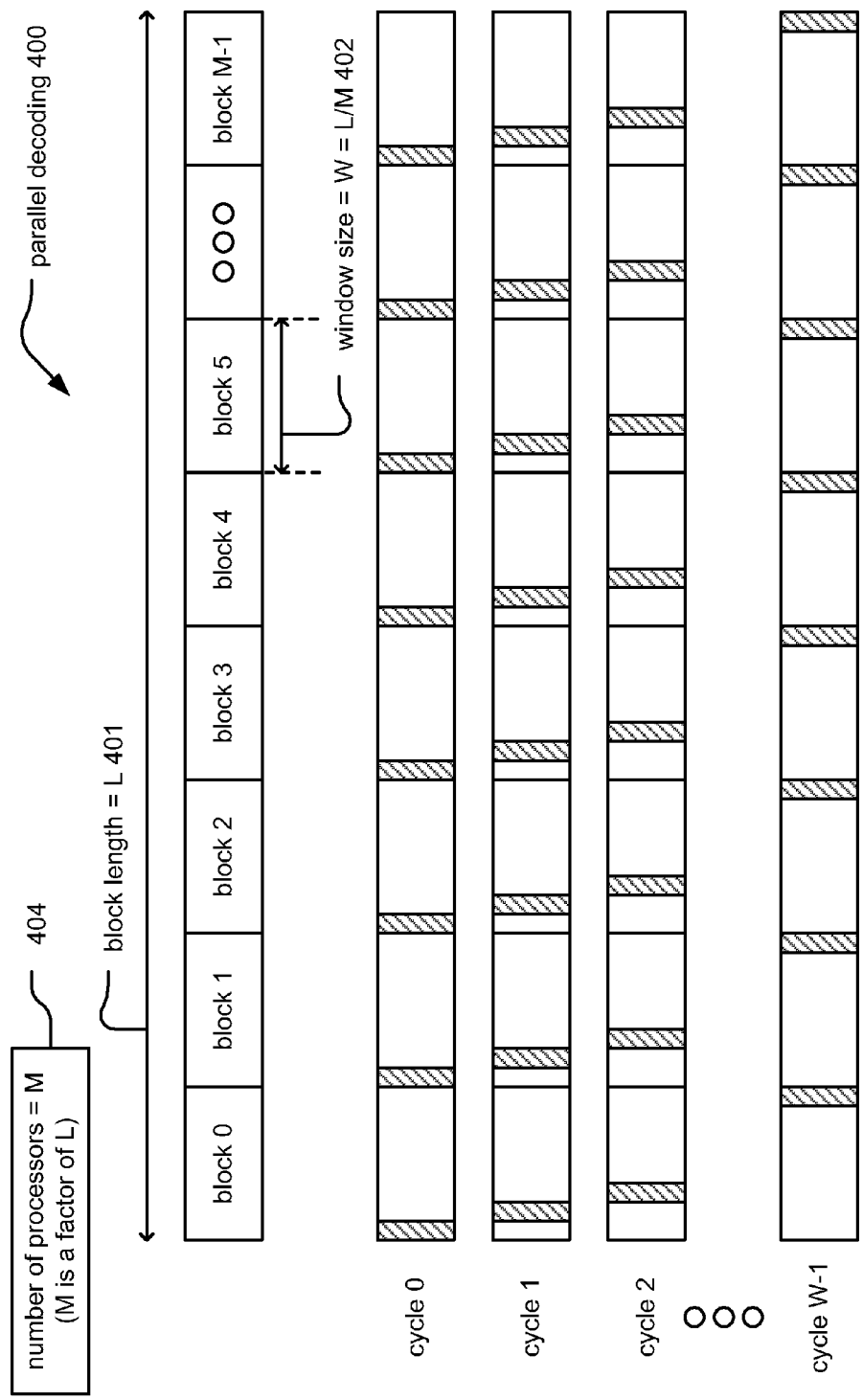
FIG. 4 illustrates an embodiment of a parallel decoding as can be applied within turbo decoding.

FIG. 4 illustrates an embodiment 400 of a parallel decoding as can be applied within turbo decoding. As can be seen, the block length 401 of an information block within the turbo coded signal is shown as L. This can also be referred to as an encoded block which will undergo turbo decoding. The block is subdivided into a plurality of windows, such that each window has size $W = L/M$, as shown by reference numeral 402. The number of processors arranged in a parallel decoding implementation is shown as M (as shown by reference numeral 404), and it is noted that M is a factor of L (i.e., M divides L with no remainder).

During a cycle 0 (i.e., a first decoding iteration within the iterative decoding processing of turbo decoding), a first portion of each window is processed, as shown by the corresponding shaded portions of each window. Then, during a cycle 1 (i.e., a second decoding iteration within the iterative decoding processing of turbo decoding), a second portion of each window is processed, as shown by the corresponding shaded portions of each window. This continues on until during a cycle W-1 (i.e., a final decoding iteration within the iterative decoding processing of turbo decoding), a final portion of each window is processed, as shown by the corresponding shaded portions of each window.

During each cycle, a given portion of each window is processed using one decoding processor (e.g., one turbo decoder) in a parallel implementation of a plurality of decoding processor (e.g., a plurality of turbo decoders).

Figure 5:
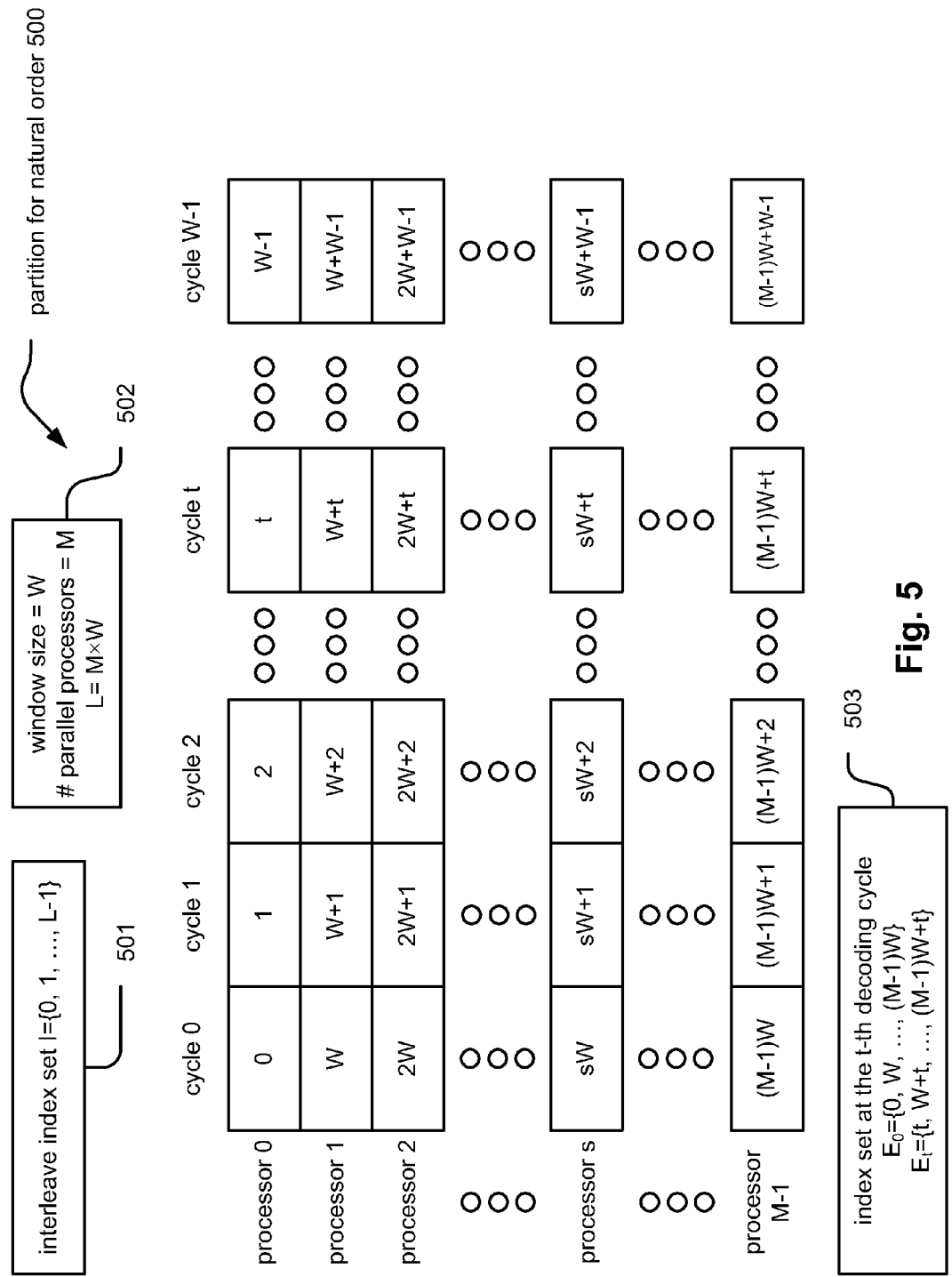
FIG. 5 illustrates an embodiment of a partitioning of decoding processors (as implemented within parallel decoding of turbo coded signals) for natural/non-interleaved order.

FIG. 5 illustrates an embodiment 500 of a partitioning of decoding processors (as implemented within parallel decoding of turbo coded signals) for natural/non-interleaved order. This diagram corresponds to FIG. 4 as well. For example, the window size, W, number of processors, M, and block length, L, conventions are the same as the previous embodiment, as shown by reference numeral 502 (i.e., $W = L|M$ or $M \cdot W = L$). In addition, the interleave index is shown as reference numeral 501, $I = \{0, 1, \ldots, L-1\}$.

In accordance with the parallel turbo decoding processing which involves employing M decoding processors, during a cycle 0 (i.e., a first decoding iteration within the iterative decoding processing of turbo decoding), the respective first portions of each window that are processed are as follows:

1. processor 0 processes portion 0 of the information block.
2. processor 1 processes portion W of the information block.

3. processor 2 processes portion 2W of the information block.
...
s. processor s processes portion sW of the information block (s is an integer).
...
M−1. processor M−1 processes portion (M−1)W of the information block.

During a cycle 1 (i.e., a second decoding iteration within the iterative decoding processing of turbo decoding), the respective second portions of each window that are processed are as follows:

1. processor 0 processes portion 1 of the information block.
2. processor 1 processes portion W+1 of the information block.
3. processor 2 processes portion 2W+1 of the information block.
...
s. processor s processes portion sW+1 of the information block (s is an integer).
...
M−1. processor M−1 processes portion (M−1)W+1 of the information block.

This process continues on until during a cycle W−1 (i.e., a final decoding iteration within the iterative decoding processing of turbo decoding), the respective second portions of each window that are processed are as follows:

1. processor 0 processes portion W−1 of the information block.
2. processor 1 processes portion W+W−1 of the information block.
3. processor 2 processes portion W+2W−1 of the information block.
...
s. processor s processes portion sW+W−1 of the information block (s is an integer).
...
M−1. processor M−1 processes portion (M−1)W+W−1 of the information block.

The index that is set at the t-th decoding cycle is as follows (as also shown by reference numeral 503):

$$E_0 = \{0, W, \ldots, (M-1)W\}, \text{ and}$$

$$E_t = \{t, W+t, \ldots, (M-1)W+t\}.$$

Figure 6:
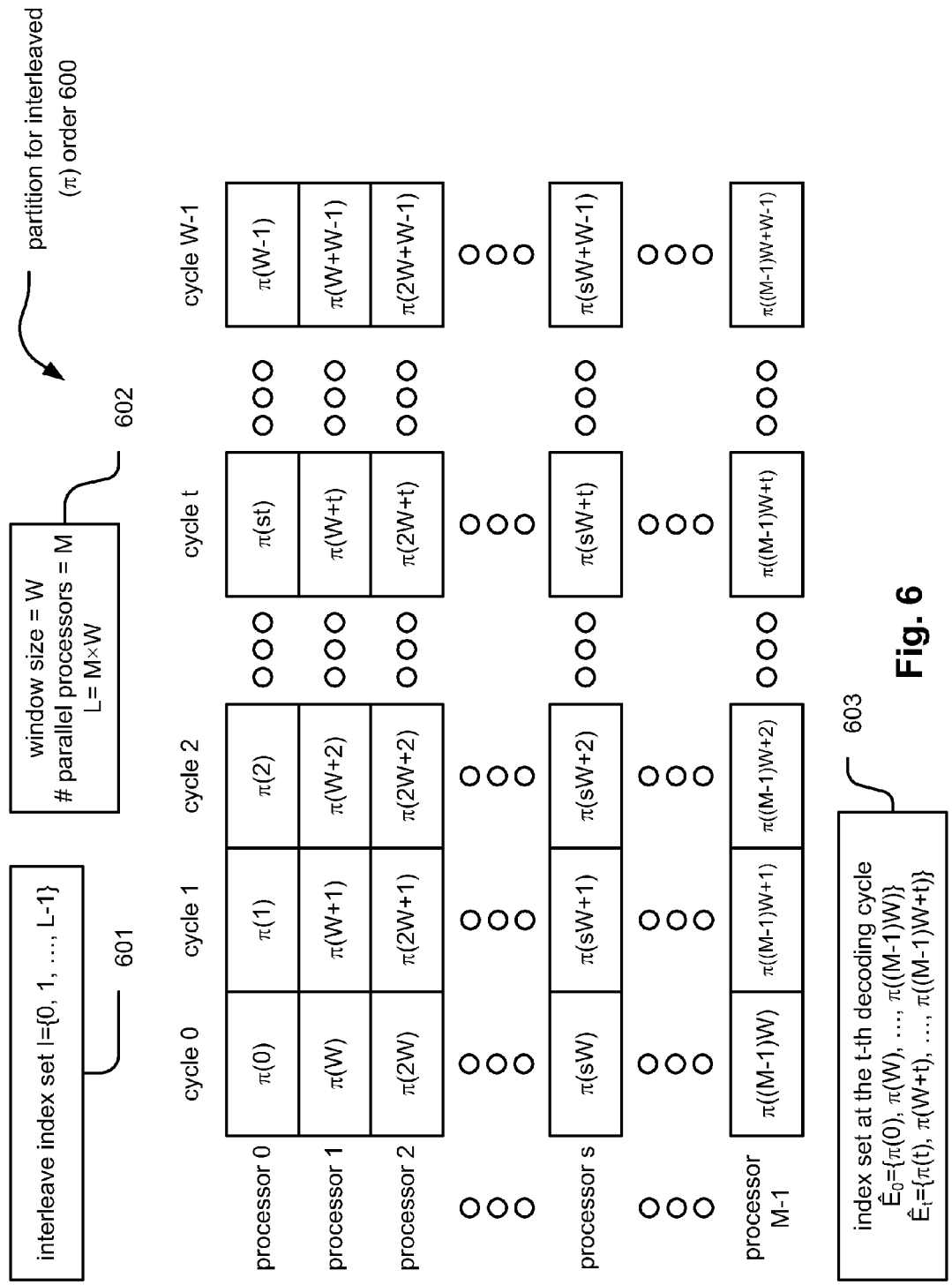
FIG. 6 illustrates an embodiment of a partitioning of decoding processors (as implemented within parallel decoding of turbo coded signals) for interleaved ($\pi$) order.

FIG. 6 illustrates an embodiment of a partitioning of decoding processors 600 (as implemented within parallel decoding of turbo coded signals) for interleaved (π) order. This diagram corresponds to FIG. 4 as well. For example, the window size, W, number of processors, M, and block length, L, conventions are the same as the previous embodiment, as shown by reference numeral 602 (i.e., W=L/M or M·W=L). In addition, the interleave index is shown as reference numeral 601, I={0, 1, ..., L−1}.

In accordance with the parallel turbo decoding processing which involves employing M decoding processors, during a cycle 0 (i.e., a first decoding iteration within the iterative decoding processing of turbo decoding), the respective first portions of each window that are processed are as follows (note: these are the interleaved (π) portions):

1. processor 0 processes portion π(0) of the information block.
2. processor 1 processes portion π(W) of the information block.
3. processor 2 processes portion π(2W) of the information block.
...
s. processor s processes portion π(2W) of the information block (s is an integer).
...
M−1. processor M−1 processes portion π((M−1)W) of the information block.

During a cycle 1 (i.e., a second decoding iteration within the iterative decoding processing of turbo decoding), the respective second portions of each window that are processed are as follows:

1. processor 0 processes portion π(1) of the information block.
2. processor 1 processes portion π(W+1) of the information block.
3. processor 2 processes portion π(2W+1) of the information block.
...
s. processor s processes portion π(sW+1) of the information block (s is an integer).
...
M−1. processor M−1 processes portion π((M−1)W+1) of the information block.

This process continues on until during a cycle W−1 (i.e., a final decoding iteration within the iterative decoding processing of turbo decoding), the respective second portions of each window that are processed are as follows:

1. processor 0 processes portion π(W−1) of the information block.
2. processor 1 processes portion π(W+W−1) of the information block.
3. processor 2 processes portion π(2W+W−1) of the information block.
...
s. processor s processes portion π(sW+W−1) of the information block (s is an integer).
...
M−1. processor M−1 processes portion π((M−1)W+W−1) of the information block.

The index that is set at the t-th decoding cycle is as follows (as also shown by reference numeral 603):

$$\hat{E}_0 = \{\pi(0), \pi(W), \ldots, \pi((M-1)W)\}, \text{ and}$$

$$\hat{E}_t = \{\pi(t), \pi(W+t), \ldots, \pi((M-1)W+t)\}.$$

Memory mapping $\mathcal{M}$ is contention-free is the following relationship holds:

$$i, i' \in E_t, i \neq i' \Rightarrow \mathcal{M}(i) \neq \mathcal{M}(i')$$

$$j, j' \in \hat{E}_t, j \neq j' \Rightarrow \mathcal{M}(j) \neq \mathcal{M}(j')$$

It is noted that the elements in the index set of the t-th cycle should be mapped to different memory banks (e.g., different memories within a plurality of memories provisioned to service a plurality of parallel arranged turbo decoders).

Figure 7:
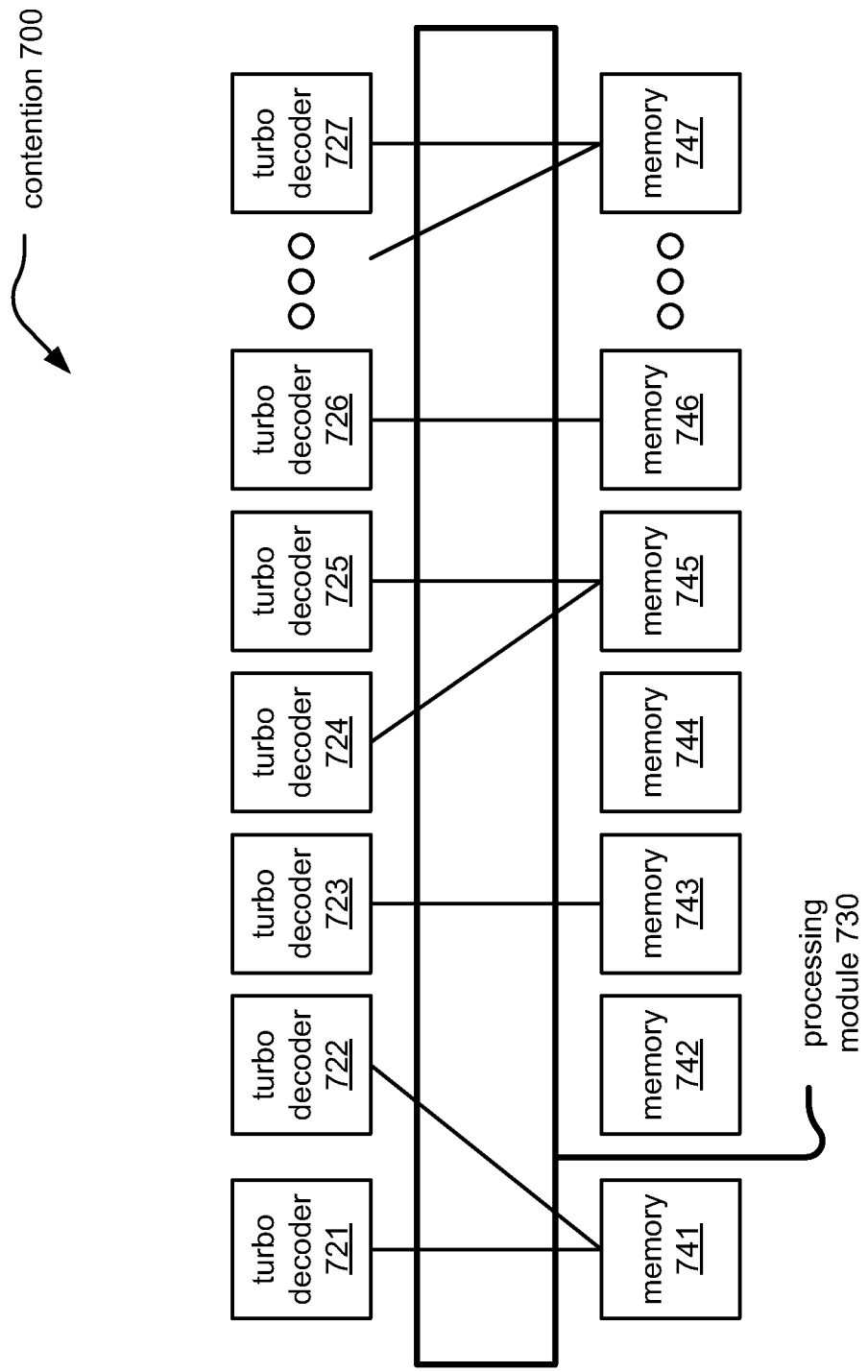
FIG. 7 illustrates an embodiment of a turbo decoder that performs parallel decoding in which contention occurs because of a lack of contention-free memory mapping between turbo decoders and memories.

FIG. 7 illustrates an embodiment of a turbo decoder 700 that performs parallel decoding in which contention occurs because of a lack of contention-free memory mapping between turbo decoders and memories.

This turbo decoder 700 includes a plurality of turbo decoders 721-727, a plurality of memories 741-747, and a processing module 730 that is operable to perform the memory mapping between the plurality of turbo decoders 721-727 and the plurality of memories 741-747. As can be seen, more than one turbo decoders tries to access a same memory at a given time. Specifically, turbo decoder 721 and turbo decoder 722 are trying to access memory 741, and turbo decoder 724 and turbo decoder 725 are trying to access memory 745. Also, turbo decoder 727 and another turbo decoder (included in the region as shown by the ellipsis . . . ) are trying to access memory 747. This creates conflicts and incurs deleterious performance.

Figure 8:
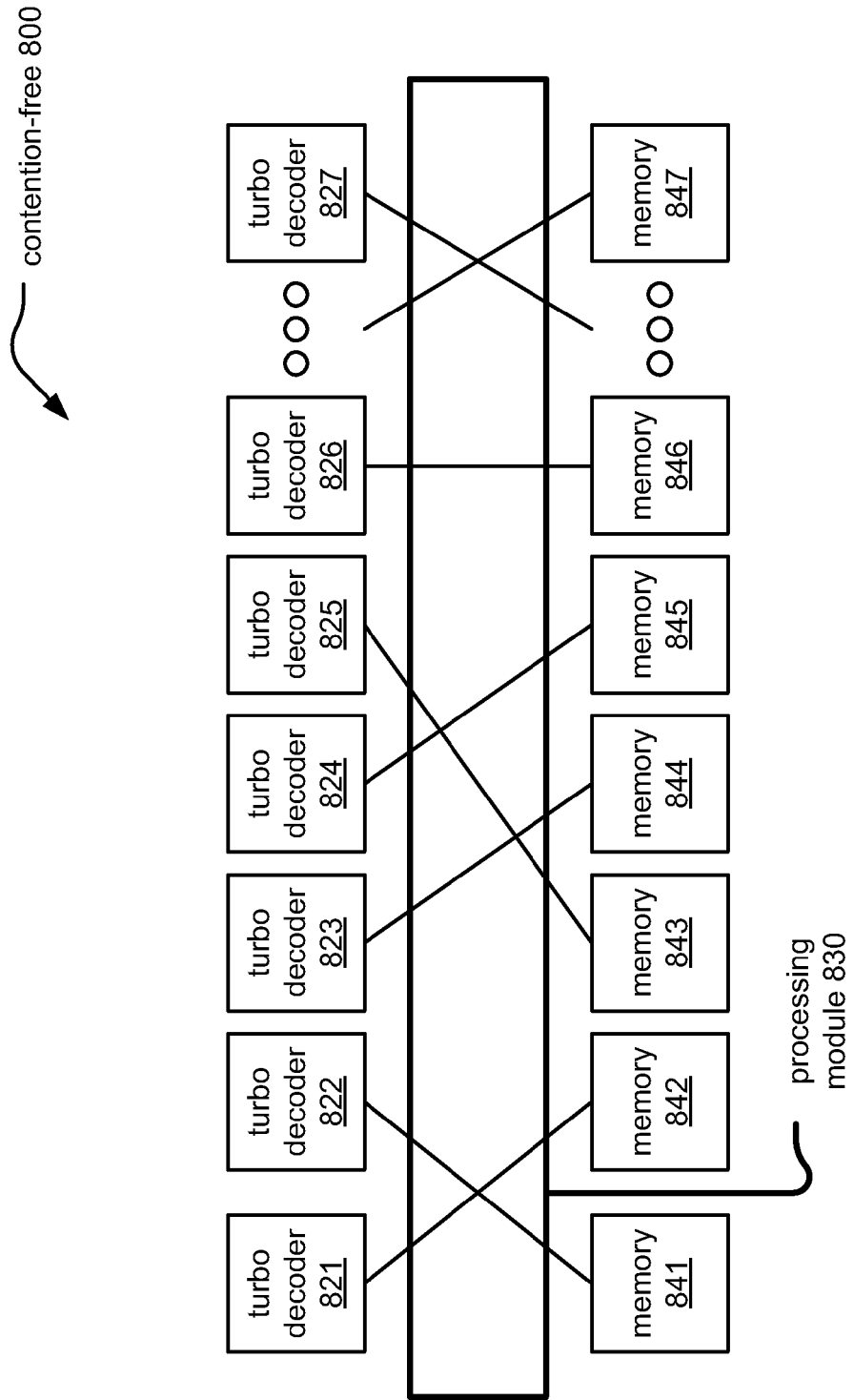
FIG. 8 illustrates an embodiment of a turbo decoder that performs parallel decoding in which no contention occurs because of contention-free memory mapping between turbo decoders and memories.

FIG. 8 illustrates an embodiment of a turbo decoder 800 that performs parallel decoding in which no contention occurs because of contention-free memory mapping between turbo decoders and memories.

This turbo decoder 800 includes a plurality of turbo decoders 821-827, a plurality of memories 841-847, and a processing module 830 that is operable to perform contention-free memory mapping between the plurality of turbo decoders 821-827 and the plurality of memories 841-847. As can be seen, only one turbo decoder accesses any one memory at a given time. This is a truly contention-free memory mapping between the plurality of turbo decoders 821-827 and the plurality of memories 841-847.

Figure 9:
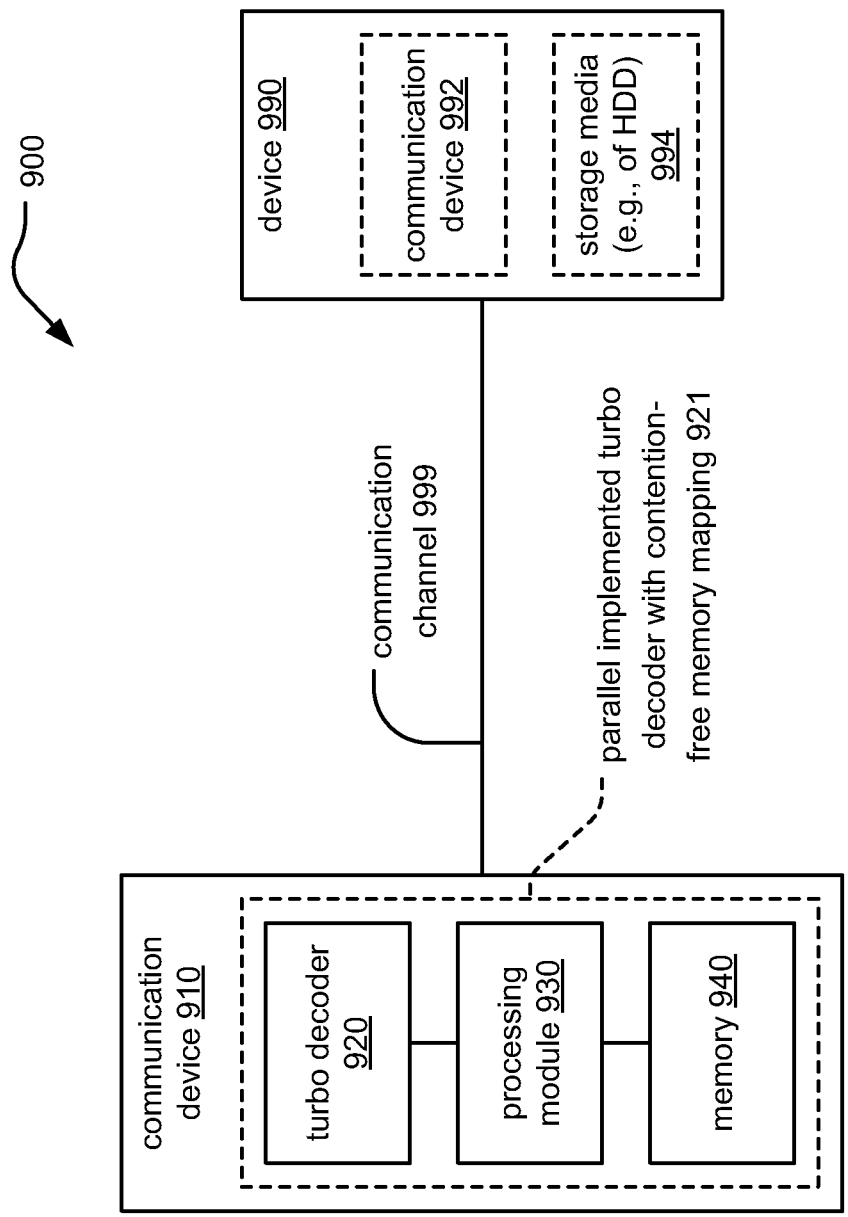
FIG. 9 and FIG. 10 illustrate other embodiments of a communication system.
Figure 10:
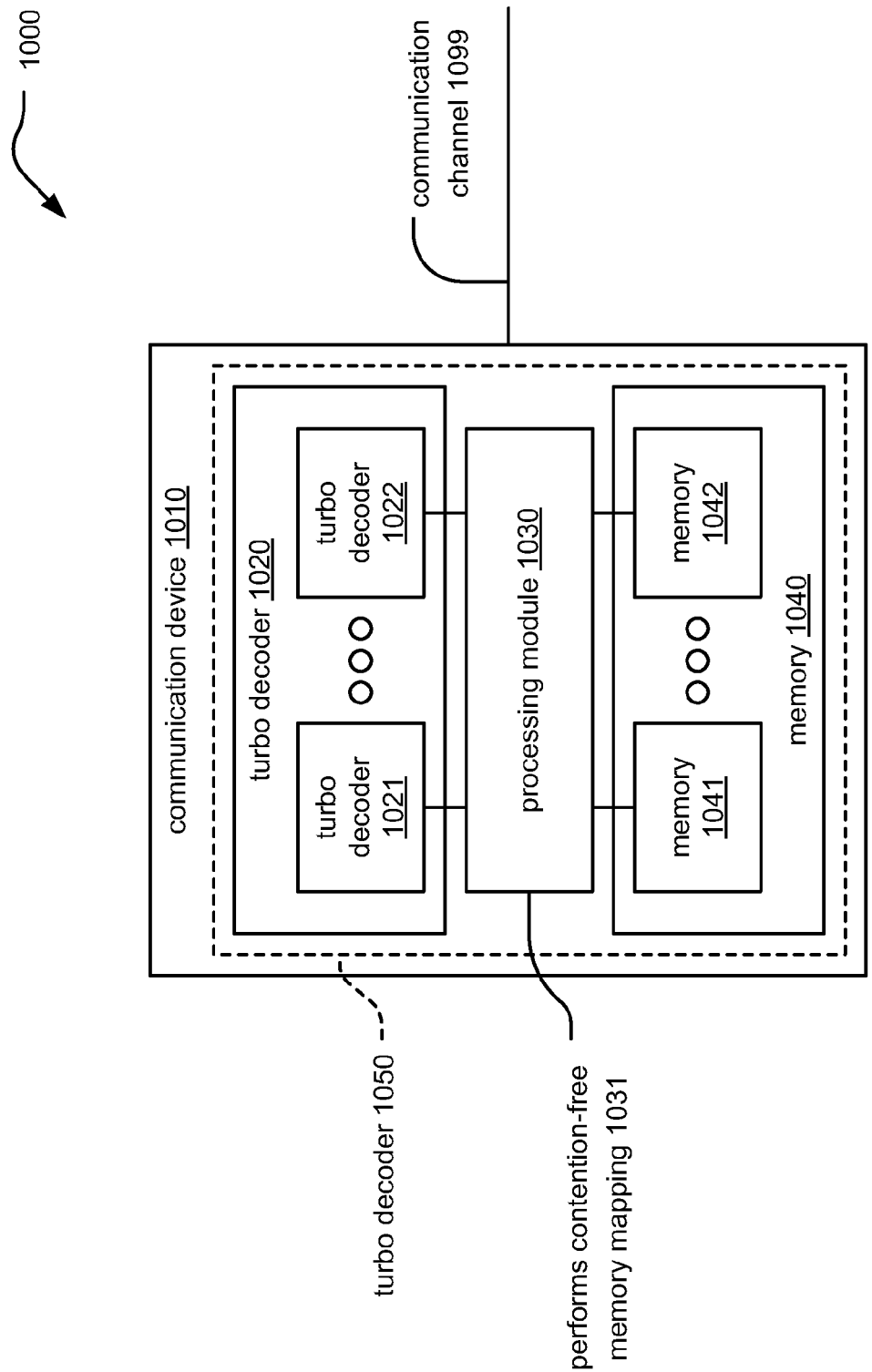

FIG. 9 and FIG. 10 illustrate other embodiments of a communication system.

Referring to the communication system 900 of FIG. 9, the communication system 900 includes a communication device 910 that is coupled to another device 990 via a communication channel 999. The communication device 910 includes a decoder 921 that is implemented as a parallel implemented turbo decoder that is operable to employ contention-free memory mapping.

The other device 990 to which the communication device 910 is coupled via the communication channel 999 can be another communication device 992, a storage media 994 (e.g., such as within the context of a hard disk drive (HDD)), or any other type of device that is capable to receive and/or transmit signals. In some embodiments, the communication channel 999 is a bi-directional communication channel that is operable to perform transmission of a first signal during a first time and receiving of a second signal during a second time. If desired, full duplex communication may also be employed, in which each of the communication device 910 and the device 990 can be transmitted and/or receiving from one another simultaneously.

The decoder 921 of the communication device 910 includes a turbo decoder 920, a processing module 930, and a memory 940. The processing module 930 can be coupled to the memory 940 so that the memory is operable to store operational instructions that enable to the processing module 930 to perform certain functions.

Generally speaking, the processing module 930 is operable to perform contention-free memory mapping between the turbo decoder 920 and the memory 940 during iterative decoding processing.

It is also noted that the processing module 930, as well as any other processing module described herein, can be implemented in any number of ways as described below. In one embodiment, the processing module 930 can be implemented strictly as circuitry. Alternatively, the processing module 930 can be implemented strictly in software such as can be employed within a digital signal processor (DSP) or similar type device. In even another embodiment, the processing module 930 can be implemented as a combination of hardware and software as well without departing from the scope and spirit of the invention.

In even other embodiments, the processing module 930 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The processing module 930 can be coupled to the memory 940 that is operable to store operational instructions that enable to processing module 930 to perform the appropriate contention-free memory mapping between the turbo decoder 920 and the memory 940.

Such a memory 940 may be a single memory device or a plurality of memory devices. Such a memory 940 may be a read-only memory, random access memory, volatile memory, non-volatile memory, static memory, dynamic memory, flash memory, and/or any device that stores digital information. Note that when the processing module 930 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

Referring to the communication system 1000 of FIG. 10, this embodiment is somewhat analogous to the previous embodiment. The communication system 1000 includes a communication device 1010 that can be coupled to another device via a communication channel 1099. The communication device 1010 includes a turbo decoder 1020 that is itself composed of a plurality of turbo decoders 1021-1022. The communication device 1010 also includes a memory 1040 that is itself composed of a plurality of memories 1041-1042. A processing module 1030 is operable to perform contention-free memory mapping between the plurality of turbo decoders 1021-1022 and the plurality of memories 1041-1042 during iterative decoding processing of a turbo coded signal.

FIG. 11A, FIG. 11B, FIG. 11C, and FIG. 11D illustrates various, successive contention-free memory mappings between turbo decoders and memories. These 4 diagrams should be considered in conjunction with one another.

A communication device includes a turbo decoder that is itself composed of a plurality of turbo decoders 1121, 1122, and 1123. Such a communication device also includes a memory that is itself composed of a plurality of memories 1141, 1142, and 1143. A processing module 1130 is operable to perform contention-free memory mapping between the plurality of turbo decoders 1121, 1122, and 1123 and the plurality of memories 1141, 1142, and 1143 during iterative decoding processing of a turbo coded signal.

At any given time, the processing module 1130 is operable to ensure that only one turbo decoder accesses a given memory at a given time. For example, a processing module 1130 is operable to perform a first contention-free memory mapping at a time 1, as shown by reference numeral 1101. The processing module 1130 is operable to perform a second contention-free memory mapping at a time 2, as shown by reference numeral 1102. The processing module 1130 is operable to perform a second contention-free memory mapping at a time 3, as shown by reference numeral 1103. The processing module 1130 is operable to perform a second contention-free memory mapping at a time 4, as shown by reference numeral 1104. As can be seen, only one turbo decoder is connected to any one memory at any given time in each of these 4 diagrams.

As can be seen, the contention-free memory mapping between the turbo decoders 1121, 1122, and 1123 and the plurality of memories 1141, 1142, and 1143 changes as a function of time during iterative decoding processing of a turbo coded signal.

There is a form of memory mapping, referred to as division mapping (i.e., DIV mapping for short) that has been defined in reference [4] cited below.

According to this DIV mapping approach, $\mathcal{M}_{DIV}: i \mapsto \lfloor i/W \rfloor$, where W is the window size of the parallel decoding architecture.

The index set at the i-th decoding cycle is as follows:

$E_i = \{i, W+i, \ldots, (M-1)W+i\}$, where

M is the number of processors, and C is the period of the ARP interleave ($\pi$).

Also, if M is a factor of the ratio, L/C, then the map on an ARP interleave ($\pi$) is in fact contention-free.

It is noted, however, that examples in the reference [3] and reference [4] cited below do not have this property.

FIG. 12A and FIG. 12B illustrate embodiments of DIV memory mapping of a plurality of memories memory banks. Each of these embodiments 1201 and 1202 correspond to the situation when M divides L/C. Also, these embodiments 1201 and 1202 employ DIV mapping on index sets (C=4, M=3 in fact is a factor of L/C=6, and W=8).

Each of these embodiments 1201 and 1202 employ a plurality of memory banks 1210 that includes 3 memory banks.

During a first decoding cycle, the memory mapping as shown in embodiment 1201 is as follows for the natural order when performing turbo decoding processing.

$E_0 = \{0,8,16\} \rightarrow \{0,1,2\}$

Also during the first decoding cycle, the memory mapping as shown in embodiment 1201 is as follows for the interleaved ($\pi$) order when performing turbo decoding processing.

$\hat{E}_0 = \{0,8,16\} \rightarrow \{0,1,2\}$

During a second decoding cycle, the memory mapping as shown in embodiment 1202 is as follows for the natural order when performing turbo decoding processing.

$E_1 = \{1,9,17\} \rightarrow \{0,1,2\}$

Also during the second decoding cycle, the memory mapping as shown in embodiment 1202 is as follows for the interleaved ($\pi$) order when performing turbo decoding processing.

$\hat{E}_1 = \{11,19,3\} \rightarrow \{2,1,0\}$

During subsequent decoding cycles (e.g., decoding iterations), the memory mapping between processors and memories is as follows:

Third decoding cycle (natural order/interleaved order) is $E_2 = \{2,10,18\} \rightarrow \{0,1,2\}/\hat{E}_2 = \{22,6,14\} \rightarrow \{1,0,2\}$.

Fourth decoding cycle (natural order/interleaved order) is $E_3 = \{3,11,19\} \rightarrow \{0,1,2\}/\hat{E}_3 = \{5,13,21\} \rightarrow \{2,1,0\}$.

Fifth decoding cycle (natural order/interleaved order) is $E_4 = \{\mathbf{4,12,20}\} \rightarrow \{\mathbf{0,1,2}\}/\hat{E}_4 = \{4,12,20\} \rightarrow \{1,0,2\}$.

Sixth decoding cycle (natural order/interleaved order) is $E_5 = \{5,13,21\} \rightarrow \{0,1,2\}/\hat{E}_5 = \{15,23,7\} \rightarrow \{0,2,1\}$.

Seventh decoding cycle (natural order/interleaved order) is $E_6 = \{6,14,22\} \rightarrow \{0,1,2\}/\hat{E}_6 = \{2,10,18\} \rightarrow \{2,1,0\}$.

Eighth decoding cycle (natural order/interleaved order) is $E_7 = \{7,15,23\} \rightarrow \{0,1,2\}/\hat{E}_7 = \{9,17,1\} \rightarrow \{0,2,1\}$.

As can be seen, the natural order and the interleaved order are both contention-free.

Continuing with another form of memory mapping, there is another form of memory mapping, referred to as modular mapping (i.e., MOD mapping for short) that has been defined in reference [1] and [2] cited below.

According to this MOD mapping approach (again, M is the number of decoding processors), $\mathcal{M}_{MOD}: i \mapsto i \bmod M$, where M is the number of decoding processors,
C is the period of the ARP interleave ($\pi$), and
M is a multiple of C.

This MOD mapping approach embodiment is only contention-free if gcd(W, M)=1.

Figure 13A:
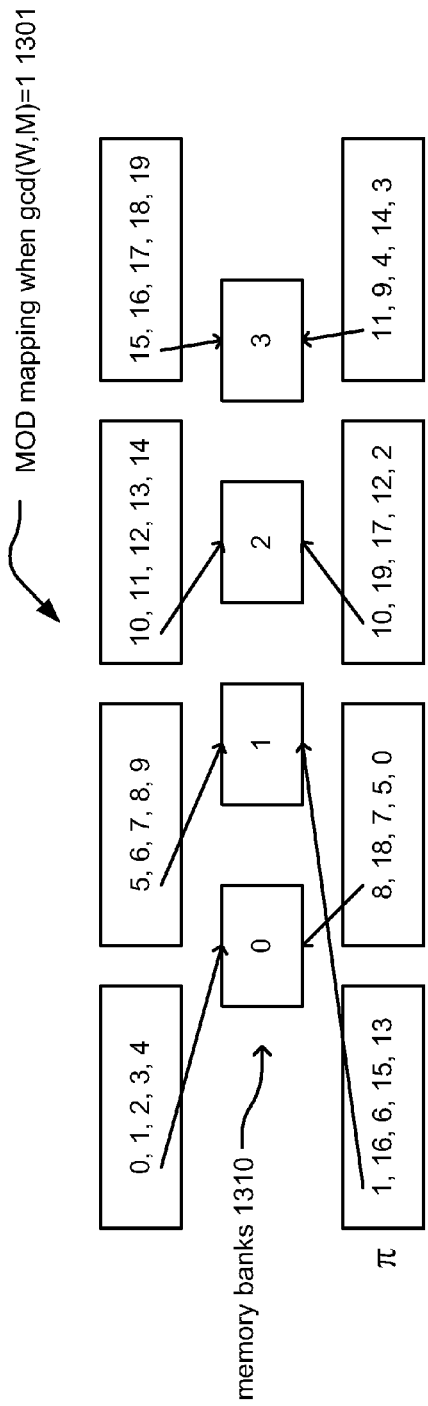
FIG. 13A and FIG. 13B illustrate embodiments of MOD memory mapping of a plurality of memories memory banks.
Figure 13B:
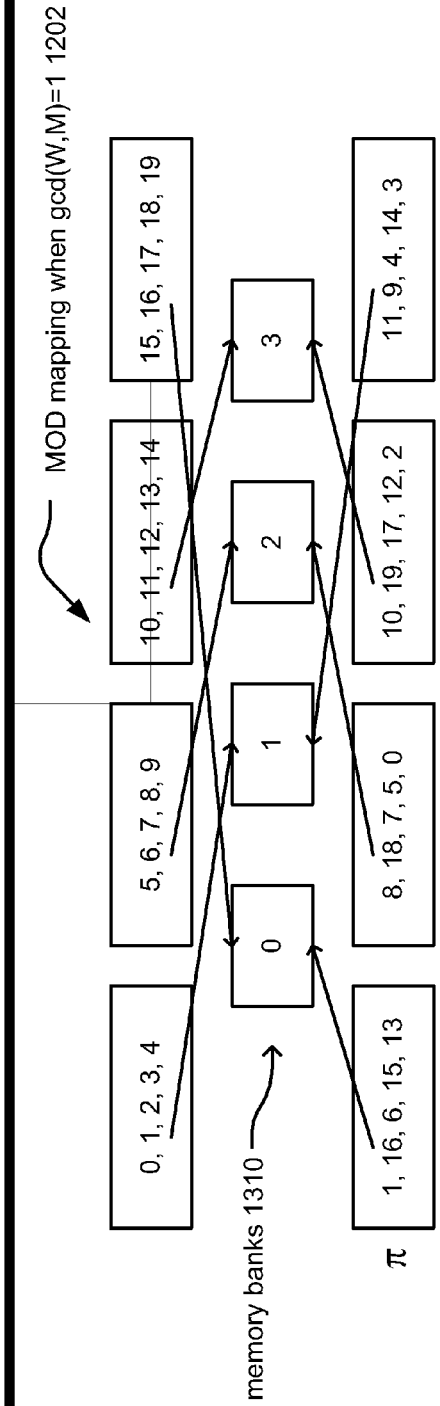

FIG. 13A and FIG. 13B illustrate embodiments of MOD memory mapping of a plurality of memories memory banks. Each of these embodiments 1301 and 1302 correspond to the situation of MOD mapping when gcd(W,M)=1. Also, these embodiments 1201 and 1202 employ MOD mapping on index sets (W=5, C=4, M=4 and gcd(W,M)=1).

Each of these embodiments 1301 and 1302 employ a plurality of memory banks 1310 that includes 4 memory banks.

During a first decoding cycle, the memory mapping as shown in embodiment 1301 is as follows for the natural order when performing turbo decoding processing.

$E_0 = \{0,5,10,15\} \rightarrow \{0,1,2,3\}$

Also during the first decoding cycle, the memory mapping as shown in embodiment 1201 is as follows for the interleaved ($\pi$) order when performing turbo decoding processing.

$\hat{E}_0 = \{1,8,10,11\} \rightarrow \{1,0,2,3\}$

During a second decoding cycle, the memory mapping as shown in embodiment 1302 is as follows for the natural order when performing turbo decoding processing.

$E_1 = \{1,6,11,16\} \rightarrow \{1,2,3,0\}$

Also during the second decoding cycle, the memory mapping as shown in embodiment 1302 is as follows for the interleaved ($\pi$) order when performing turbo decoding processing.

$\hat{E}_1 = \{16,18,19,9\} \rightarrow \{0,2,3,1\}$

During subsequent decoding cycles (e.g., decoding iterations), the memory mapping between processors and memories is as follows:

Third decoding cycle (natural order/interleaved order) is $E_2 = \{2,7,12,17\} \rightarrow \{2,3,0,1\}/\hat{E}_2 = \{6,7,17,4\} \rightarrow \{2,3,1,0\}$.

Fourth decoding cycle (natural order/interleaved order) is $E_3 = \{3,8,13,18\} \rightarrow \{3,0,1,2\}/\hat{E}_3 = \{15,5,12,14\} \rightarrow \{3,1,0,2\}$.

Fifth decoding cycle (natural order/interleaved order) is $E_4 = \{4,9,14,19\} \rightarrow \{0,1,2,3\}/\hat{E}_4 = \{13,0,2,3\} \rightarrow \{1,0,2,3\}$.

As can be seen in this embodiment, the natural order and the interleaved order are both contention-free.

However, many of the previous embodiments, particular those that employs an ARP interleave ($\pi$) within the turbo encoding and turbo decoding, there is a restriction in the number of decoding processors, M, that can be employed. For example, these previous embodiments necessitate that the number of decoding processors, M, be a factor of the length of the information block, L.

The following provides a means by which an arbitrarily selected number (M) of decoding processors can be employed for performing parallel turbo decoding processing.

In doing so, a virtual block length, L', is judiciously chosen such that the arbitrarily selected number (M) of decoding processors can be employed in conjunction with an appropriate memory mapping that is contention-free.

Figure 14:
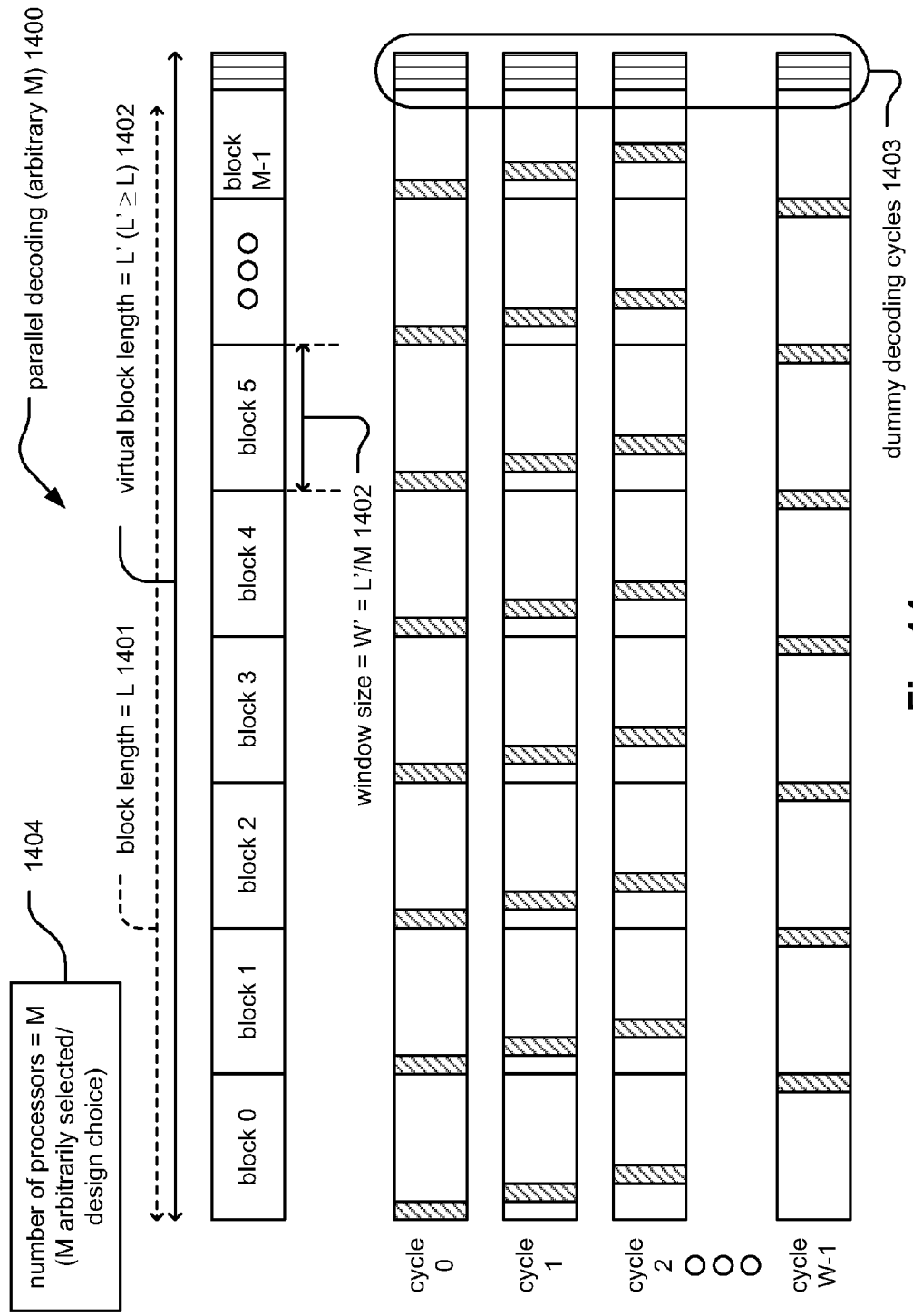
FIG. 14 illustrates an embodiment of a parallel turbo decoding of a turbo coded signal when employing an arbitrarily selected number (M) of decoding processors.

FIG. 14 illustrates an embodiment 1400 of a parallel turbo decoding of a turbo coded signal when employing an arbitrarily selected number (M) of decoding processors. As can be seen, the block length 1401 of an information block within the turbo coded signal is shown as L, and the virtual block length 1402 of a slightly extended information block within the turbo coded signal is shown as L'. It is this virtual block length 1402 that can be referred to as an encoded block which will undergo turbo decoding. The block is subdivided into a plurality of windows, such that each window has size W'=L'/M, as shown by reference numeral 1402. The number of processors arranged in a parallel decoding implementation is shown as M (as shown by reference numeral 1404), and it is again noted that M is the arbitrarily selected number of decoding processors.

It is particularly that there no longer is any requirement that M be a factor of L (i.e., M divides L with no remainder) as there is with many of the embodiments described above.

During a cycle 0 (i.e., a first decoding iteration within the iterative decoding processing of turbo decoding), a first portion of each window is processed, as shown by the corresponding shaded portions of each window. Then, during a cycle 1 (i.e., a second decoding iteration within the iterative decoding processing of turbo decoding), a second portion of each window is processed, as shown by the corresponding shaded portions of each window. This continues on until during a cycle W-1 (i.e., a final decoding iteration within the iterative decoding processing of turbo decoding), a final portion of each window is processed, as shown by the corresponding shaded portions of each window.

During each cycle, a given portion of each window is processed using one decoding processor (e.g., one turbo decoder) in a parallel implementation of a plurality of decoding processor (e.g., a plurality of turbo decoders).

This embodiment differs from the previous embodiment of FIG. 4 in at least the fact that there may be one or more dummy cycles 1403 that are performed when decoding near the end of the virtual block length 1402.

Figure 15:
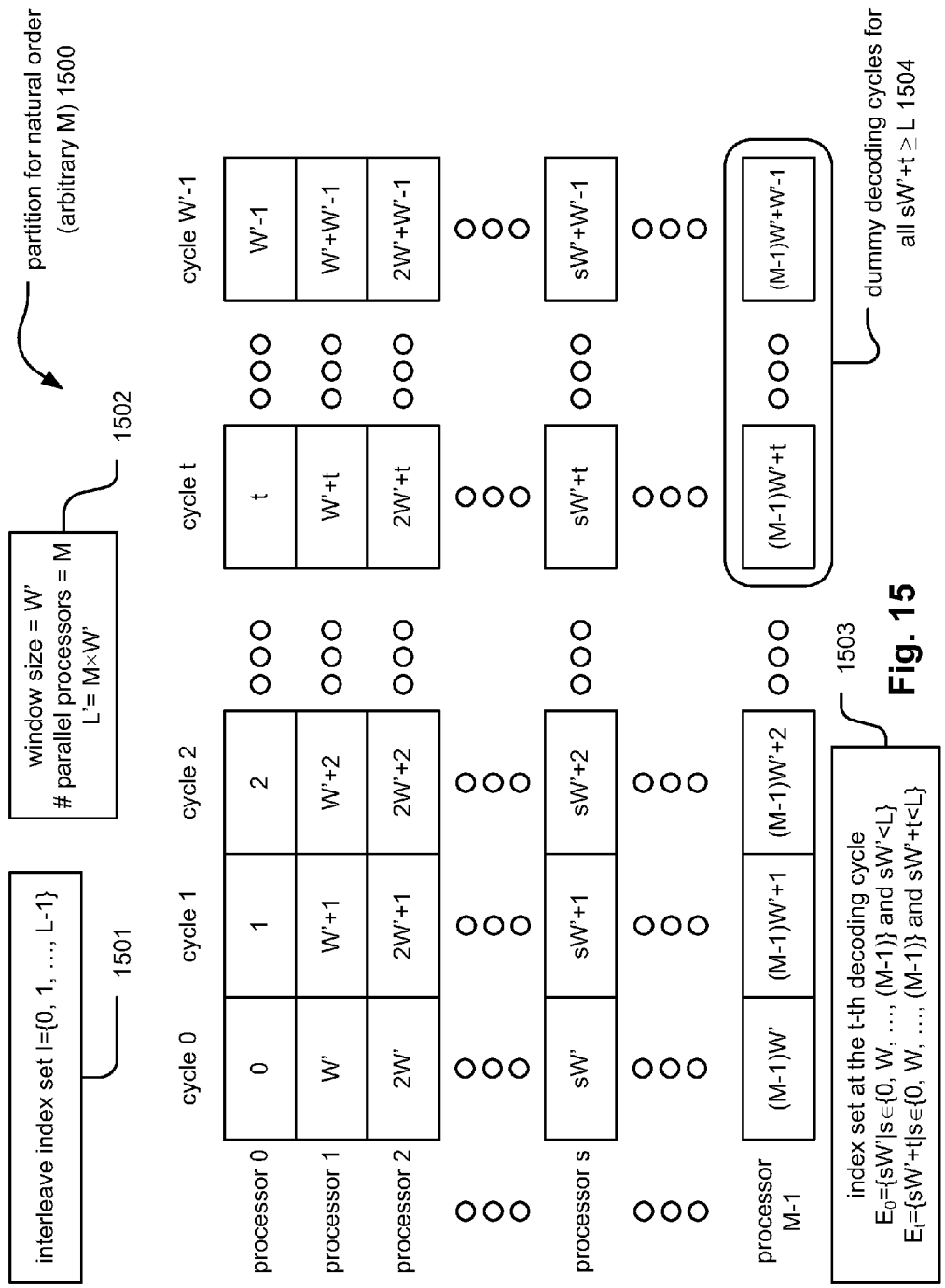
FIG. 15 illustrates an embodiment of a partitioning of an arbitrarily selected number (M) of decoding processors (as implemented within parallel decoding of turbo coded signals) for natural/non-interleaved order.

FIG. 15 illustrates an embodiment of a partitioning of an arbitrarily selected number (M) of decoding processors (as implemented within parallel decoding of turbo coded signals) for natural/non-interleaved order. This diagram corresponds to FIG. 14 as well. For example, the window size, W', number of processors, M, and virtual block length, L', conventions are the same as the previous embodiment, as shown by reference numeral 1502 (i.e., W'=L'/M or M·W'=L'). In addition, the interleave index is shown as reference numeral 1501, I={0, 1, . . . , L−1}.

In accordance with the parallel turbo decoding processing which involves employing M decoding processors, during a cycle 0 (i.e., a first decoding iteration within the iterative decoding processing of turbo decoding), the respective first portions of each window that are processed are as follows:
1. processor 0 processes portion 0 of the information block.
2. processor 1 processes portion W' of the information block.
3. processor 2 processes portion 2W' of the information block.
. . .
s. processor s processes portion sW' of the information block (s is an integer).
. . .
M−1. processor M−1 processes portion (M−1)W' of the information block.

During a cycle 1 (i.e., a second decoding iteration within the iterative decoding processing of turbo decoding), the respective second portions of each window that are processed are as follows:
1. processor 0 processes portion 1 of the information block.
2. processor 1 processes portion W'+1 of the information block.
3. processor 2 processes portion 2W'+1 of the information block.
. . .
s. processor s processes portion sW'+1 of the information block (s is an integer).
. . .
M−1. processor M−1 processes portion (M−1)W'+1 of the information block.

This process continues on until during a cycle W'−1 (i.e., a final decoding iteration within the iterative decoding processing of turbo decoding), the respective second portions of each window that are processed are as follows:
1. processor 0 processes portion W'−1 of the information block.
2. processor 1 processes portion W'+W'−1 of the information block.
3. processor 2 processes portion W'+2W'−1 of the information block.
. . .
s. processor s processes portion sW'+W'−1 of the information block (s is an integer).
. . .
M−1. processor M−1 processes portion (M−1)W'+W'−1 of the information block.

The index that is set at the t-th decoding cycle is as follows (as also shown by reference numeral 1503):

$$E_0 = \{sW' | s \in \{0,1,\ldots,M-1\} \text{ and } sW' \leq L\}, \text{ and}$$

$$E_t = \{sW'+t | s \in \{0,1,\ldots,M-1\} \text{ and } sW'+t \leq L\}.$$

It is also noted that certain of the processors may perform dummy decoding cycles (i.e., be idle) as shown by reference numeral 1504. There are dummy decoding cycles for all sW'+t≥L.

Figure 16:
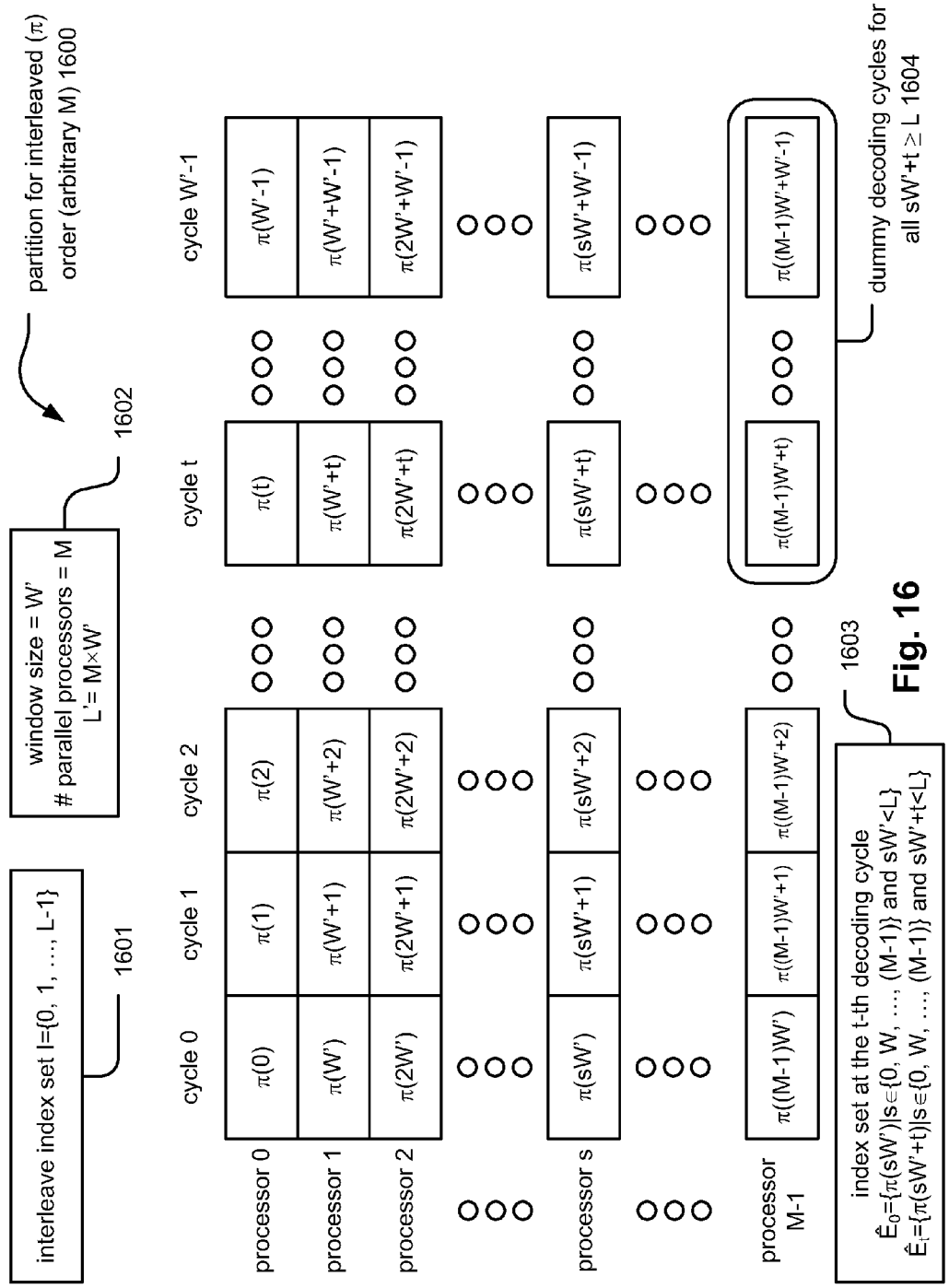
FIG. 16 illustrates an embodiment of a partitioning of an arbitrarily selected number (M) of decoding processors (as implemented within parallel decoding of turbo coded signals) for interleaved ($\pi$) order.

FIG. 16 illustrates an embodiment 1600 of a partitioning of an arbitrarily selected number (M) of decoding processors (as implemented within parallel decoding of turbo coded signals) for interleaved (π) order. This diagram corresponds to FIG. 14 as well. For example, the window size, W', number of processors, M, and virtual block length, L', conventions are the same as the previous embodiment, as shown by reference numeral 1602 (i.e., W'=L'/M or M·W'=L'). In addition, the interleave index is shown as reference numeral 1601, I={0, 1, . . . , L−1}.

In accordance with the parallel turbo decoding processing which involves employing M decoding processors, during a cycle 0 (i.e., a first decoding iteration within the iterative decoding processing of turbo decoding), the respective first portions of each window that are processed are as follows (note: these are the interleaved (π) portions):
1. processor 0 processes portion π(0) of the information block.
2. processor 1 processes portion π(W') of the information block.
3. processor 2 processes portion π(2W') of the information block.
. . .
s. processor s processes portion π(sW') of the information block (s is an integer).
. . .
M−1. processor M−1 processes portion π((M−1)W') of the information block.

During a cycle 1 (i.e., a second decoding iteration within the iterative decoding processing of turbo decoding), the respective second portions of each window that are processed are as follows:

1. processor 0 processes portion π(1) of the information block.

2. processor 1 processes portion π(W'+1) of the information block.

3. processor 2 processes portion π(2W'+1) of the information block.

...

s. processor s processes portion π(sW'+1) of the information block (s is an integer).

...

M−1. processor M−1 processes portion π((M−1)W'+1) of the information block.

This process continues on until during a cycle W'−1 (i.e., a final decoding iteration within the iterative decoding processing of turbo decoding), the respective second portions of each window that are processed are as follows:

1. processor 0 processes portion π(W'−1) of the information block.

2. processor 1 processes portion π(W'+W'−1) of the information block.

3. processor 2 processes portion π(2W'+W'−1) of the information block.

...

s. processor s processes portion π(sW'+W'−1) of the information block (s is an integer).

...

M−1. processor M−1 processes portion π((M−1)W'+W'−1) of the information block.

The index that is set at the t-th decoding cycle is as follows (as also shown by reference numeral 1603):

$$\hat{E}_0 = \{\pi(sW') | s \in \{0,1,\ldots,M-1\} \text{ and } sW' < L\}, \text{ and}$$

$$\hat{E}_t = \{\pi(sW'+t) | s \in \{0,1,\ldots,M-1\} \text{ and } sW'+t < L\}.$$

It is also noted that certain of the processors may perform dummy decoding cycles (i.e., be idle) as shown by reference numeral 1604. There are dummy decoding cycles for all sW'+t≥L.

FIG. 17A and FIG. 17B illustrate embodiments of parallel turbo decoding of a turbo coded signal when employing an arbitrarily selected number (M) of decoding processors and employing MOD memory mapping a plurality of memories memory banks.

The following approach (Method 1) is then applied to the following example (MOD mapping).

Step 1: For a given M, choose a $\tilde{C}$ such that π(x) is an ARP interleave (π) with period $\tilde{C}$ and M≤$\tilde{C}$. (e.g., see property 4 described above with respect to an ARP interleave (π)). Then, C is the number of memory banks (e.g., memories) to be used, and is preferably selected as being small for better efficiency.

Step 2: Find a W' such that $$W' \geq \left\lceil \frac{L}{M} \right\rceil$$

and gcd(W',$\tilde{C}$)=1. Set L'=MW'.

W' is the number of decoding cycles (e.g., decoding iterations) that is required in each phase (e.g., in natural order phase of decoding and interleaved phase of decoding, and is preferably selected as being small for better efficiency.

Typically, $$W' - \left\lceil \frac{L}{M} \right\rceil$$

can be selected as being relatively small.

Step 3: Use $\tilde{C}$ memory banks (e.g., memories) and memory mapping as follows:

$$\mathcal{M}(x) = \mathcal{M}_{MOD}(x) = x \bmod \tilde{C}.$$

Step 3: In cycle t, decoding processor s processes bit position sW'+t in the natural order phase of decoding, and π(sW'+t) in the interleaved order phase of decoding, provided sW'+t<L, otherwise, decoding processor s does nothing (i.e., remains idle).

Proof of Validity of Method 1:

In the natural order phase of decoding, if $\mathcal{M}(s_0 W'+t) = \mathcal{M}(s_1 W'+t)$, then $s_0 W' \equiv s_1 W' \bmod \tilde{C}$. But $s_0$ and $s_1$ are less than M≤$\tilde{C}$ and gcd(W', $\tilde{C}$)=1. So, $\mathcal{M}(s_0 W'+t) = \mathcal{M}(s_1 W'+t) \Rightarrow s_0 = s_1$.

In the interleaved order phase of decoding, if $\mathcal{M}(\pi(s_0 W'+t)) = \mathcal{M}(\pi(s_1 W'+t))$, then $\pi(s_0 W'+t) \equiv \pi(s_1 W'+t) \bmod \tilde{C}$. By property 2 of an ARP interleave (π) with period $\tilde{C}$ (Property 2 is described above), then $\pi(s_0 W'+t) \equiv \pi(s_1 W'+t) \bmod \tilde{C}$, which then implies $(s_0 W'+t) \equiv (s_1 W'+t) \bmod \tilde{C}$.

So, once again, the following relationship holds: $s_0 = s_1$.

The previous approach (Method 1) is then applied to the following example. Initially, these parameters are provided to the designer: L=24, C=4, P=7.

Step 1: Select the number decoding processors; assume that one wants to use 5 processors, e.g., M=5.

Step 2: choose the scheduled ARP period, $\tilde{C}$. Choose $\tilde{C}$=8 for this example. It is noted that, generally, the chosen value for the scheduled ARP period, $\tilde{C}$, is an integer multiple of C.

Step 3: Let the virtual window size, W', be as follows: W'=5 ⇒ L'=25. This corresponds to a virtual block length of 25.

Step 4: Use 8 memory banks (e.g., memories), and set the memory mapping as follows: $\mathcal{M}(x) = x \bmod 8$.

Each of these embodiments 1701 and 1702 employ a plurality of memory banks 1710 that includes 8 memory banks.

During a first decoding cycle, the memory mapping as shown in embodiment 1701 is as follows for the natural order when performing turbo decoding processing.

$$E_0 = \{0,5,10,15,20\} \rightarrow \{0,5,2,7,4\}$$

Also during the first decoding cycle, the memory mapping as shown in embodiment 1701 is as follows for the interleaved (π) order when performing turbo decoding processing.

$$\hat{E}_0 = \{0,15,6,17,20\} \rightarrow \{0,7,6,1,4\}$$

During a second decoding cycle, the memory mapping as shown in embodiment 1702 is as follows for the natural order when performing turbo decoding processing.

$$E_1 = \{1,6,11,16,21\} \rightarrow \{1,6,3,0,5\}$$

Also during the second decoding cycle, the memory mapping as shown in embodiment 1702 is as follows for the interleaved (π) order when performing turbo decoding processing.

$$\hat{E}_1 = \{11,2,13,16,7\} \rightarrow \{3,2,5,0,7\}$$

During subsequent decoding cycles (e.g., decoding iterations), the memory mapping between processors and memories is as follows:

Third decoding cycle (natural order/interleaved order) is $E_2=\{2,7,12,17,22\} \rightarrow \{2,7,4,1,6\}/\hat{E}_2=\{22,9,12,3,18\} \rightarrow \{6,1,4,3,2\}$.

Fourth decoding cycle (natural order/interleaved order) is $E_3=\{3,8,13,18,23\} \rightarrow \{3,0,5,2,7\}/\hat{E}_3=\{5,8,23,14,1\} \rightarrow \{5,0,7,6,1\}$.

Fifth decoding cycle (natural order/interleaved order) is $E_4=\{4,9,14,19\} \rightarrow \{4,1,6,3\}/\hat{E}_4=\{4,19,10,21\} \rightarrow \{4,3,2,5\}$.

As can be seen, the natural order and the interleaved order are both contention-free.

In accordance with Method 1 as provided above, there are some additional properties for finding W'.

One of which is: if $\tilde{C}=p^m$ with p prime, then for any integer W, either $\gcd(W,\tilde{C})=1$ or $\gcd(W+1,\tilde{C})=1$. This can be proven by the following: if p divides W, then p does not divide W+1.

One of which is: if $\tilde{C}=2^m 3^n$, then for any integer W, there exists a $\epsilon \in \{0, 1, 2, 3\}$ such that $\gcd(W+\epsilon,\tilde{C})=1$. This can be proven using the following:

$$\varepsilon = \begin{cases} 0 & \text{if } W = 1 \text{ or } 5 \bmod 6 \\ 1 & \text{if } W = 0 \text{ or } 4 \bmod 6 \\ 2 & \text{if } W = 3 \bmod 6 \\ 3 & \text{if } W = 2 \bmod 6. \end{cases}$$

Some advantages provided by various aspects of the invention include the ability to remove the restriction on M, which is the number of decoding processors (e.g., parallel arranged turbo decoders). Generally speaking, a designer has the opportunity to select whatever number of decoding processors is desired in a particular turbo coding application that employs an embodiment of an ARP interleaver ($\pi$).

In addition, because of this ability to perform the selection of number of decoding processors (e.g., parallel arranged turbo decoders), a designer has a great deal of flexibility in terms of optimizing various design criteria, including area, power, latency, among other design considerations.

FIG. 18A illustrates an embodiment of a turbo decoder that is operable to perform decoding of a turbo coded signal when employing an arbitrarily selected number (M) of decoding processors for all decoding cycles except dummy decoding cycles.

This embodiment illustrates the typical arrangement (except that the memory mapping will change for different decoding cycles) for all of the decoding cycles except for dummy decoding cycles.

This embodiment 1801 of turbo 1800 includes a plurality of turbo decoders 1821-1827, a plurality of memories 1841-1847, and a processing module 1830 that is operable to perform contention-free memory mapping between the plurality of turbo decoders 1821-1827 and the plurality of memories 1841-1847. As can be seen, only one turbo decoder accesses any one memory at a given time. This is a truly contention-free memory mapping between the plurality of turbo decoders 1821-1827 and the plurality of memories 1841-1847.

As can be seen, each turbo decoder within the plurality of turbo decoders 1821-1827 is operable within these decoding cycles. Again, the particular memory mapping depicted in this embodiment 1801 corresponds to one particular memory mapping, and the memory mapping will change for various decoding cycles.

FIG. 18B illustrates an embodiment of a turbo decoder that is operable to perform decoding of a turbo coded signal when employing an arbitrarily selected number (M) of decoding processors for dummy decoding cycles.

This embodiment illustrates the arrangement (again, except that the memory mapping will change for different decoding cycles) for all of the decoding cycles that involve performing some dummy decoding cycles for at least some of the turbo decoders within the plurality of turbo decoders 1821-1827.

This embodiment 1802 of turbo 1800 includes a plurality of turbo decoders 1821-1827, a plurality of memories 1841-1847, and a processing module 1830 that is operable to perform contention-free memory mapping between the plurality of turbo decoders 1821-1827 and the plurality of memories 1841-1847. As can be seen, only one turbo decoder accesses any one memory at a given time. This is a truly contention-free memory mapping between the plurality of turbo decoders 1821-1827 and the plurality of memories 1841-1847.

As can also be seen, a first subset of turbo decoders within the plurality of turbo decoders 1821-1827 is operable within these decoding cycles (i.e., turbo decoders 1821-1825), and a second subset of turbo decoders within the plurality of turbo decoders 1821-1827 is not operable within these decoding cycles (i.e., turbo decoders 1826-1827). These turbo decoders 1826-1827 perform dummy decoding processing, as shown by reference numeral 1804, in which the turbo decoders 1826-1827 are idle during these decoding cycles. Again, the particular memory mapping depicted in this embodiment 1802 corresponds to one particular memory mapping, and the memory mapping will change for various decoding cycles.

Figure 19:
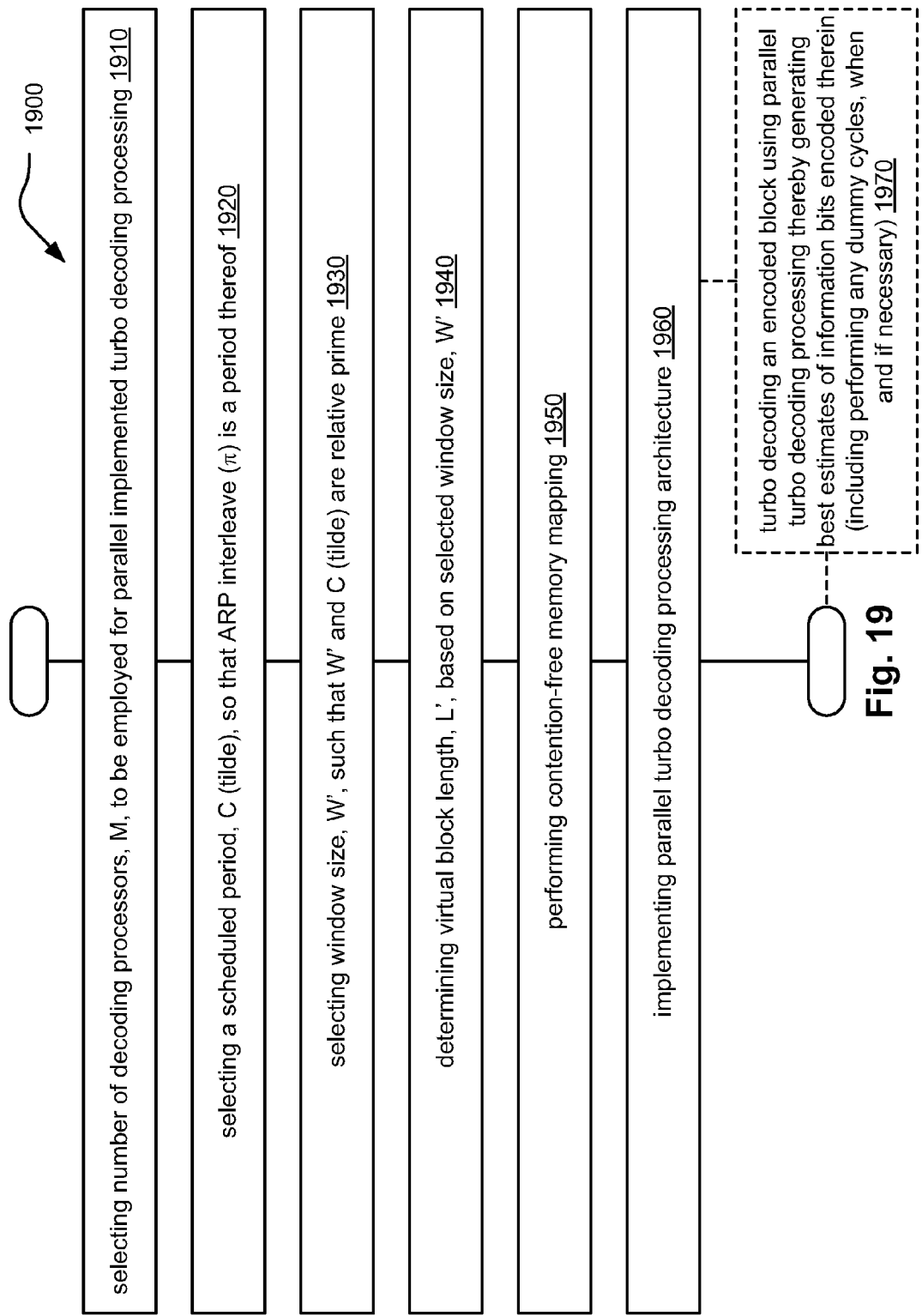
FIG. 19 illustrates an embodiment of a method for designed a parallel implemented decoding architecture that includes an arbitrarily selected number (M) of decoding processors.

FIG. 19 illustrates an embodiment of a method 1900 for designed a parallel implemented decoding architecture that includes an arbitrarily selected number (M) of decoding processors.

As shown in a block 1910, the method 1900 begins by selecting number of decoding processors, M, to be employed for parallel implemented turbo decoding processing. The method 1900 continues by selecting a scheduled period, C (tilde) (i.e., $\tilde{C}$), so that ARP interleave ($\pi$) is a period thereof, as shown in a block 1920. The method 1900 continues by selecting window size, W', such that W' and C (tilde) (i.e., $\tilde{C}$) are relative prime, as shown in a block 1930. The method 1900 continues by determining virtual block length, L', based on selected window size, W', as shown in a block 1940. The method 1900 continues by performing contention-free memory mapping, as shown in a block 1950. The method 1900 continues by implementing parallel turbo decoding processing architecture, as shown in a block 1960. If desired in some embodiments, the method 1900 can continue by turbo decoding an encoded block using parallel turbo decoding processing thereby generating best estimates of information bits encoded therein (including performing any dummy cycles, when and if necessary), as shown in a block 1970.

Figure 20:
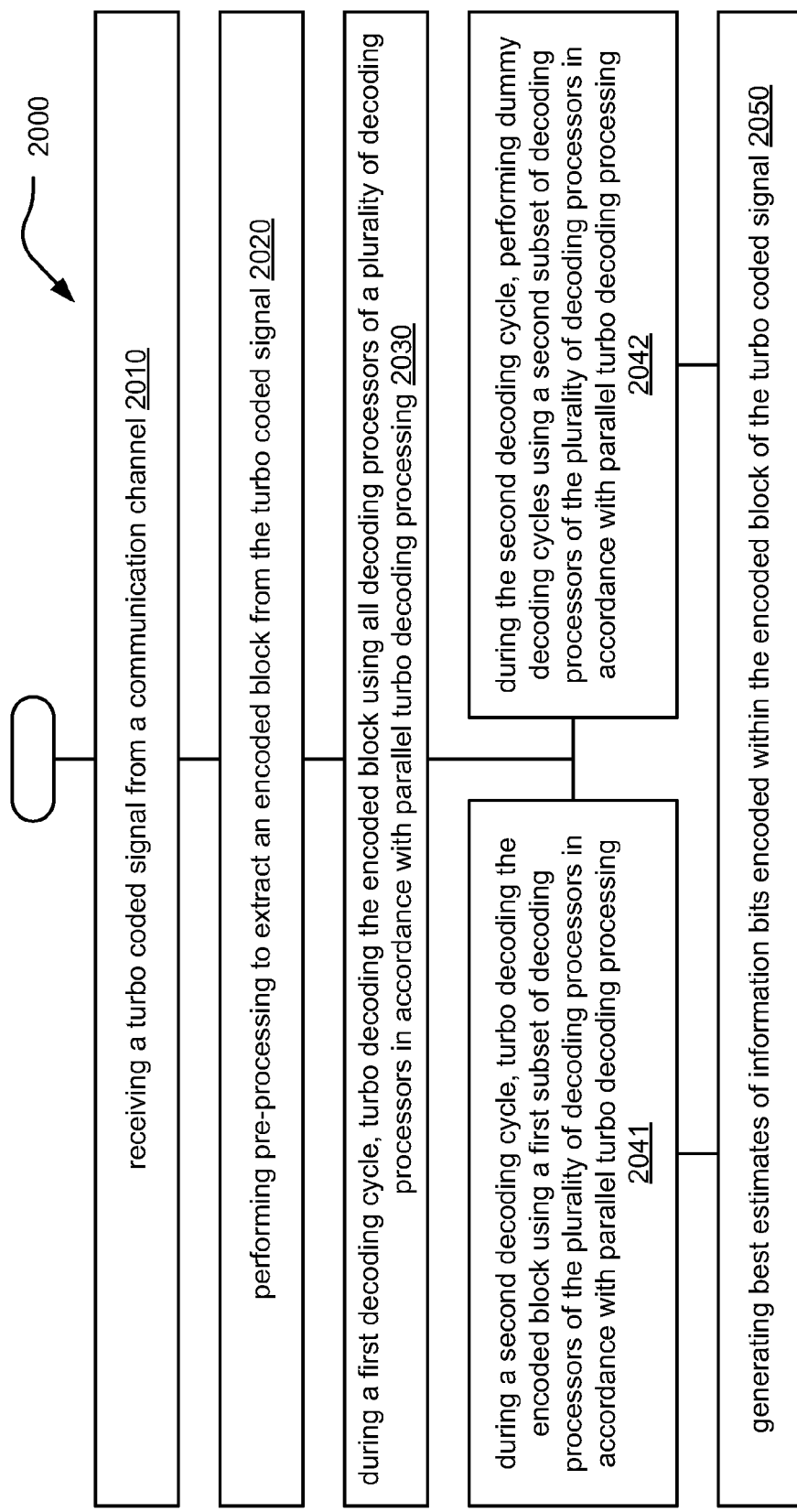
FIG. 20 illustrates an embodiment of a method for decoding a turbo coded signal.

FIG. 20 illustrates an embodiment of a method 2000 for decoding a turbo coded signal. As shown in a block 2010, the method 2000 begins by receiving a turbo coded signal from a communication channel. The method 2000 continues by performing pre-processing to extract an encoded block from the turbo coded signal, as shown in a block 2020. The method 2000 continues by during a first decoding cycle, turbo decoding the encoded block using all decoding processors of a plurality of decoding processors in accordance with parallel turbo decoding processing, as shown in a block 2030.

The method 2000 continues by performing two operations during a second decoding cycle. The method 2000 continues by during a second decoding cycle, turbo decoding the encoded block using a first subset of decoding processors of the plurality of decoding processors in accordance with parallel turbo decoding processing, as shown in a block 2041, and the method 2000 continues by during the second decoding cycle, performing dummy decoding cycles using a second subset of decoding processors of the plurality of decoding processors in accordance with parallel turbo decoding processing, as shown in a block 2042. The method 2000 then continues by generating best estimates of information bits encoded within the encoded block of the turbo coded signal, as shown in a block 2050.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

REFERENCES

[1] C. Berrou, Y. Saouter, C. Douillard, S. Kerouédan, and M. Jézéquel, "Designing good permutations for turbo codes: towards a single model," 2004 *IEEE International Conference on Communications (ICC)*, Vol.: 1, pp: 341-345, 20-24 Jun. 2004.
[2] France Telecom, GET, "Enhancement of Rel. 6 turbo Code," 3GPP TSG RAN WG1#43, R1-051310, 2005.
[3] Motorola, "A contention-free interleaver design for LTE codes," 3GPP TSG RAN WG1#47.
[4] A. Nimbalker, T. E. Fuja, D. J. Costello, Jr. T. K. Blankenship and B. Classon, "Contention-Free Interleavers," *IEEE ISIT* 2004, Chicago, USA, Jun. 27-Jul. 2, 2004.

What is claimed is:
1. An apparatus comprising:
a plurality of memories;
a plurality of turbo decoders configured to decode a turbo coded signal having an information block length, L, such that the plurality of turbo decoders including at most L turbo decoders; and
a processing module, coupled to the plurality of memories and the plurality of turbo decoders, configured to perform contention-free mapping between the plurality of memories and the plurality of turbo decoders during a plurality of decoding cycles; and wherein:
during at least one of the plurality of decoding cycles:
a first subset of the plurality of turbo decoders is configured to process information from a subset of the plurality of memories, such that each turbo decoder of the first subset of a plurality of turbo decoders processing respective information from a respective, corresponding one memory of the subset of the plurality of memories, to generate updated information; and
a second subset of the plurality of turbo decoders is configured to perform dummy decoding; and
the apparatus is configured to employ the updated information to generate estimates of information bits encoded within the turbo coded signal.

2. The apparatus of claim 1, wherein during at least one additional of the plurality of decoding cycles occurring before the at least one of the plurality of decoding cycles, all of the plurality of turbo decoders to process information from all of the plurality of memories, such that each of the plurality of turbo decoders to process at least one additional respective information from at least one additional respective, corresponding one of the plurality of memories, to generate prior updated information; and
the plurality of turbo decoders to employ the prior updated information and the updated information to generate the estimates of information bits encoded within the turbo coded signal.

3. The apparatus of claim 1, wherein the contention-free mapping corresponding to an almost regular permutation (ARP) interleaving by which the turbo coded signal has been generated.

4. The apparatus of claim 1, wherein contention-free mapping during a first of the plurality of decoding cycles being defined according to a first almost regular permutation (ARP) dithering cycle, a first virtual block length, and a first window size; and
contention-free mapping during a second of the plurality of decoding cycles being defined according to a second ARP dithering cycle, a second virtual block length, and a second window size.

5. The apparatus of claim 1, wherein during at least one additional of the plurality of decoding cycles occurring before the at least one of the plurality of decoding cycles, the processing module effectuating is further configured to perform contention-free mapping between all of the plurality of memories and all of the plurality of turbo decoders;
during the at least one of the plurality of decoding cycles, the processing module is further configured to perform contention-free mapping between the subset of the plurality of memories and the first subset of the plurality of turbo decoders; and
during the at least one of the plurality of decoding cycles, no memory within the second subset of the plurality of turbo decoders being coupled to any of the plurality of memories.

6. The apparatus of claim 1, the plurality of turbo decoders including a first number of turbo decoders; and
the plurality of memories including a second number of memories.

7. The apparatus of claim 1, wherein a number of the at least one of the plurality of decoding cycles during which the second subset of the plurality of turbo decoders performing dummy decoding being based on the information block length, L.

8. The apparatus of claim 1, wherein the turbo coded signal being received from storage media of a hard disk drive (HDD).

9. The apparatus of claim 1, wherein the apparatus being a communication device; and
the communication device being operative within at least one of a satellite communication system, a wireless communication system, a wired communication system, and a fiber-optic communication system.

10. An apparatus comprising:
a plurality of memories including a first number of memories;
a plurality of turbo decoders configured to decode a turbo coded signal having an information block length, L, such that the plurality of turbo decoders including a second number of turbo decoders being less than or equal to L; and
a processing module, coupled to the plurality of memories and the plurality of turbo decoders, configured to perform contention-free mapping between the plurality of memories and the plurality of turbo decoders during a plurality of decoding cycles; and wherein:
during at least one of the plurality of decoding cycles:
a first subset of the plurality of turbo decoders is configured to process information from a subset of the plurality of memories, such that each turbo decoder of the first subset of a plurality of turbo decoders processing respective information from a respective, corresponding one memory the subset of the plurality of memories, to generate updated information; and
a second subset of the plurality of turbo decoders, being based on the information block length, L, is configured to perform dummy decoding; and
the apparatus is configured to employ the updated information to generate estimates of information bits encoded within the turbo coded signal.

11. The apparatus of claim 10, wherein during at least one additional of the plurality of decoding cycles occurring before the at least one of the plurality of decoding cycles, all of the plurality of turbo decoders to process information from all of the plurality of memories, such that each of the plurality of turbo decoders to process at least one additional respective information from at least one additional respective, corresponding one of the plurality of memories, thereby generating prior updated information; and
the plurality of turbo decoders employing the prior updated information and the updated information to generate the estimates of information bits encoded within the turbo coded signal.

12. The apparatus of claim 10, wherein during at least one additional of the plurality of decoding cycles occurring before the at least one of the plurality of decoding cycles, the processing module is further configured to perform contention-free mapping between all of the plurality of memories and all of the plurality of turbo decoders;
during the at least one of the plurality of decoding cycles, the processing module is further configured to perform contention-free mapping between the subset of the plurality of memories and the first subset of the plurality of turbo decoders; and
during the at least one of the plurality of decoding cycles, no memory within the second subset of the plurality of turbo decoders being coupled to any of the plurality of memories.

13. The apparatus of claim 10, wherein the apparatus being a communication device; and
the communication device being operative within at least one of a satellite communication system, a wireless communication system, a wired communication system, and a fiber-optic communication system.

14. A method for execution by a communication device, the method comprising:
receiving a turbo coded signal having an information block length, L, from a communication channel;
effectuating contention-free mapping between a plurality of memories and a plurality of turbo decoders during a plurality of decoding cycles, such that the plurality of turbo decoders including at most L turbo decoders;
during at least one of the plurality of decoding cycles:
operating a first subset of a plurality of turbo decoders in accordance with processing information from a subset of the plurality of memories, such that each turbo decoder of the first subset of a plurality of turbo decoders processing respective information from a respective, corresponding one memory of the subset of the plurality of memories, to generate updated information; and
operating a second subset of the plurality of turbo decoders in accordance with dummy decoding; and
employing the updated information to generate estimates of information bits encoded within the turbo coded signal.

15. The method of claim 14, further comprising:
during at least one additional of the plurality of decoding cycles occurring before the at least one of the plurality of decoding cycles, operating all of the plurality of turbo decoders processing information from all of the plurality of memories, such that each of the plurality of turbo decoders configured to process at least one additional respective information from at least one additional respective, corresponding one of the plurality of memories, to generate prior updated information; and
employing the prior updated information and the updated information to generate the estimates of information bits encoded within the turbo coded signal; and wherein a number of the at least one of the plurality of decoding cycles during which the second subset of the plurality of turbo decoders performing dummy decoding being based on the information block length, L.

16. The method of claim 14, further comprising:
effectuating the contention-free mapping corresponding to an almost regular permutation (ARP) interleaving by which the turbo coded signal has been generated.

17. The method of claim 14, further comprising:
effectuating the contention-free mapping during a first of the plurality of decoding cycles as defined according to a first almost regular permutation (ARP) dithering cycle, a first virtual block length, and a first window size; and
effectuating contention-free mapping during a second of the plurality of decoding cycles as defined according to a second ARP dithering cycle, a second virtual block length, and a second window size.

18. The method of claim 14, further comprising:
during at least one additional of the plurality of decoding cycles occurring before the at least one of the plurality of decoding cycles, effectuating contention-free mapping between all of the plurality of memories and all of the plurality of turbo decoders;
during the at least one of the plurality of decoding cycles, effectuating contention-free mapping between the subset of the plurality of memories and the first subset of the plurality of turbo decoders; and during the at least one of the plurality of decoding cycles, decoupling each memory within the second subset of the plurality of turbo decoders from the plurality of memories.

19. The method of claim 14, wherein the plurality of turbo decoders including a first number of turbo decoders; and the plurality of memories including a second number of memories.

20. The method of claim 14, wherein the communication device being operative within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

| | | |
|---|---|---|
| PATENT NO. | : 8,572,469 B2 | Page 1 of 1 |
| APPLICATION NO. | : 12/915936 | |
| DATED | : October 29, 2013 | |
| INVENTOR(S) | : Tak K. Lee et al. | |

It is certified that error appears in the above-identified patent and that said Letters Patent is hereby corrected as shown below:

In the Claims:

Col. 22, line 50, in claim 5: after "processing module" delete "effectuating"

Col. 22, line 62, in claim 6: after "The apparatus of claim 1" insert --wherein--

Col. 23, line 32, in claim 10: after "one memory" insert --of--

Signed and Sealed this
Twenty-ninth Day of July, 2014

Michelle K. Lee
*Deputy Director of the United States Patent and Trademark Office*